United States Patent
Prakash et al.

(10) Patent No.: US 11,450,393 B1
(45) Date of Patent: Sep. 20, 2022

(54) COUNTERMEASURES FOR PERIODIC OVER PROGRAMMING FOR NON-VOLATILE MEMORY

(71) Applicant: SanDisk Technologies LLC, Addison, TX (US)

(72) Inventors: Abhijith Prakash, Milpitas, CA (US); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/195,878

(22) Filed: Mar. 9, 2021

(51) Int. Cl.
*G11C 16/06* (2006.01)
*G11C 16/34* (2006.01)
*G11C 16/10* (2006.01)
*G11C 16/04* (2006.01)

(52) U.S. Cl.
CPC ...... *G11C 16/3463* (2013.01); *G11C 16/0483* (2013.01); *G11C 16/10* (2013.01)

(58) Field of Classification Search
CPC .. G11C 16/3463; G11C 16/0483; G11C 16/10
See application file for complete search history.

(56) References Cited

U.S. PATENT DOCUMENTS

| | | | |
|---|---|---|---|
| 8,804,425 B2 | 8/2014 | Chen et al. | |
| 9,013,928 B1 | 4/2015 | Dutta et al. | |
| 9,124,325 B2 | 9/2015 | Hoshino et al. | |
| 9,165,659 B1 | 10/2015 | Pang et al. | |
| 10,614,898 B1 | 4/2020 | Yang et al. | |
| 2017/0206978 A1* | 7/2017 | Joo | G11C 16/10 |
| 2020/0051649 A1* | 2/2020 | Her | G11C 16/3463 |
| 2020/0194078 A1* | 6/2020 | Kondo | G11C 16/10 |

* cited by examiner

*Primary Examiner* — Uyen Smet
(74) *Attorney, Agent, or Firm* — Dickinson Wright PLLC; Steven C. Hurles

(57) ABSTRACT

A non-volatile memory apparatus and method of operation are provided. The apparatus includes storage elements connected to a word line. Each of the storage elements is configured to be programmed to a respective target data state. The apparatus also includes a respective bit line associated with each of the storage elements and a control circuit configured to apply a plurality of program pulses to the word line that progressively increase by a program step voltage. The control circuit counts an over programming number of the storage elements having a threshold voltage exceeding an over programming verify level of the respective target data state that is less than a default verify level and based on the program step voltage. The control circuit adjusts a voltage of the respective bit line to one or more adjusted levels in response to the over programming number being greater than a predetermined over programming number.

17 Claims, 16 Drawing Sheets

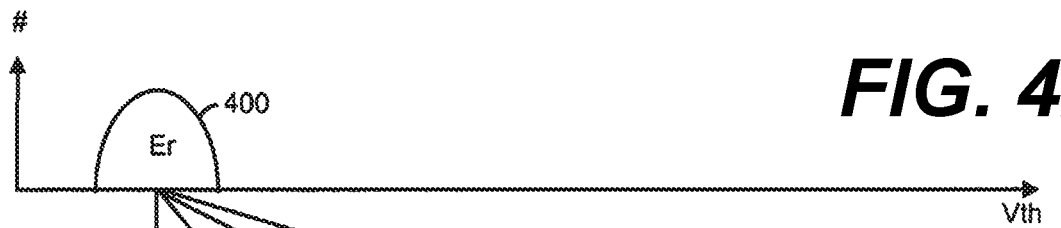
FIG. 4A
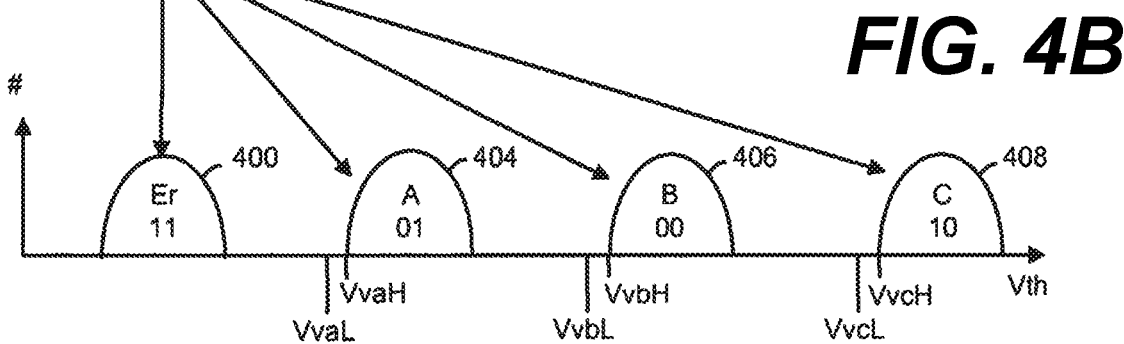
FIG. 4B
FIG. 5A
FIG. 5B
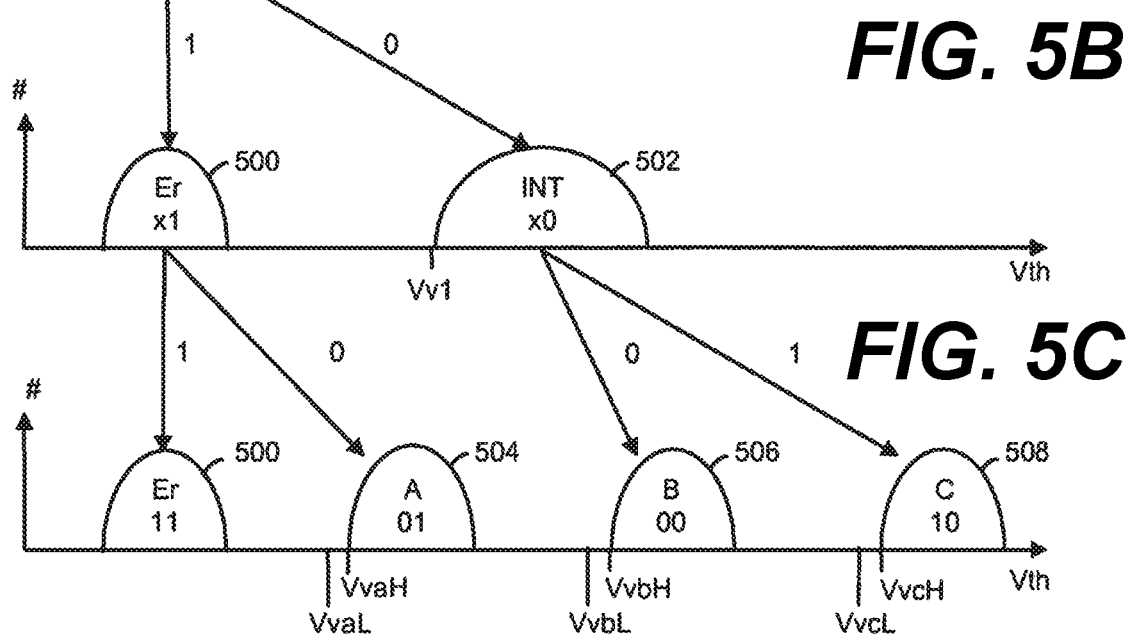
FIG. 5C

COUNTERMEASURES FOR PERIODIC OVER PROGRAMMING FOR NON-VOLATILE MEMORY

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Techniques are needed for accurately programming the threshold voltage ranges, in particular, as memory devices are scaled down.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a non-volatile memory apparatus. The non-volatile memory apparatus includes a plurality of non-volatile storage elements connected to a word line. Each of the plurality of non-volatile storage elements is configured to be programmed to a respective target data state among a plurality of target data states. The non-volatile memory apparatus also includes a respective bit line associated with each of the plurality of non-volatile storage elements. In addition, the non-volatile memory apparatus includes a control circuit configured, in a program operation, to apply one of a plurality of program pulses to the word line. The plurality of program pulses progressively increase in magnitude in each of a plurality of loops by a program step voltage. The control circuit is also configured to count an over programming number of the plurality of non-volatile storage elements having a threshold voltage exceeding at least one over programming verify level of the respective target data state being less than a default verify level and based on the program step voltage. The control circuit adjusts a voltage of the respective bit line of the plurality of non-volatile storage elements to one or more adjusted levels to modulate a programming speed in response to the over programming number being greater than a predetermined over programming number. The one or more adjusted levels is greater or less than an initial level by a delta bit line voltage.

According to another aspect of the disclosure, a controller in communication with a non-volatile memory apparatus is also provided. The non-volatile memory apparatus includes a plurality of non-volatile storage elements connected to a word line. Each of the plurality of non-volatile storage elements is configured to be programmed to a respective target data state among a plurality of target data states. The non-volatile memory apparatus also includes a respective bit line associated with each of the plurality of non-volatile storage elements. The controller is, in a program operation, to instruct the non-volatile memory apparatus to apply one of a plurality of program pulses to the word line, the plurality of program pulses progressively increasing in magnitude in each of a plurality of loops by a program step voltage. The controller is also configured to count an over programming number of the plurality of non-volatile storage elements having a threshold voltage exceeding at least one over programming verify level of the respective target data state being less than a default verify level and based on the program step voltage. In addition, the controller is configured to instruct the non-volatile memory apparatus to adjust a voltage of the respective bit line of the plurality of non-volatile storage elements to one or more adjusted levels to modulate a programming speed in response to the over programming number being greater than a predetermined over programming number. The one or more adjusted levels is greater or less than an initial level by a delta bit line voltage.

According to an additional aspect of the disclosure a method of operating a non-volatile memory apparatus is provided. The non-volatile memory apparatus includes a plurality of non-volatile storage elements connected to a word line. Each of the plurality of non-volatile storage elements is configured to be programmed to a respective target data state among a plurality of target data states. The non-volatile memory apparatus includes a respective bit line associated with each of the plurality of non-volatile storage elements. The method, in a program operation, includes the step of applying one of a plurality of program pulses to the word line, the plurality of program pulses progressively increasing in magnitude in each of a plurality of loops by a program step voltage. The next step of the method is counting an over programming number of the plurality of non-volatile storage elements having a threshold voltage exceeding at least one over programming verify level of the respective target data state being less than a default verify level and based on the program step voltage. The method continues with the step of adjusting a voltage of the respective bit line of the plurality of non-volatile storage elements to one or more adjusted levels to modulate a programming speed in response to the over programming number being greater than a predetermined over programming number. The one or more adjusted levels is greater or less than an initial level by a delta bit line voltage.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 4A and 4B depict a one pass program operation with fast and slow programming modes according to aspects of the disclosure;

FIGS. 5A to 5C depict a two pass program operation with fast and slow programming modes used on the second pass according to aspects of the disclosure;

Figure 8A:
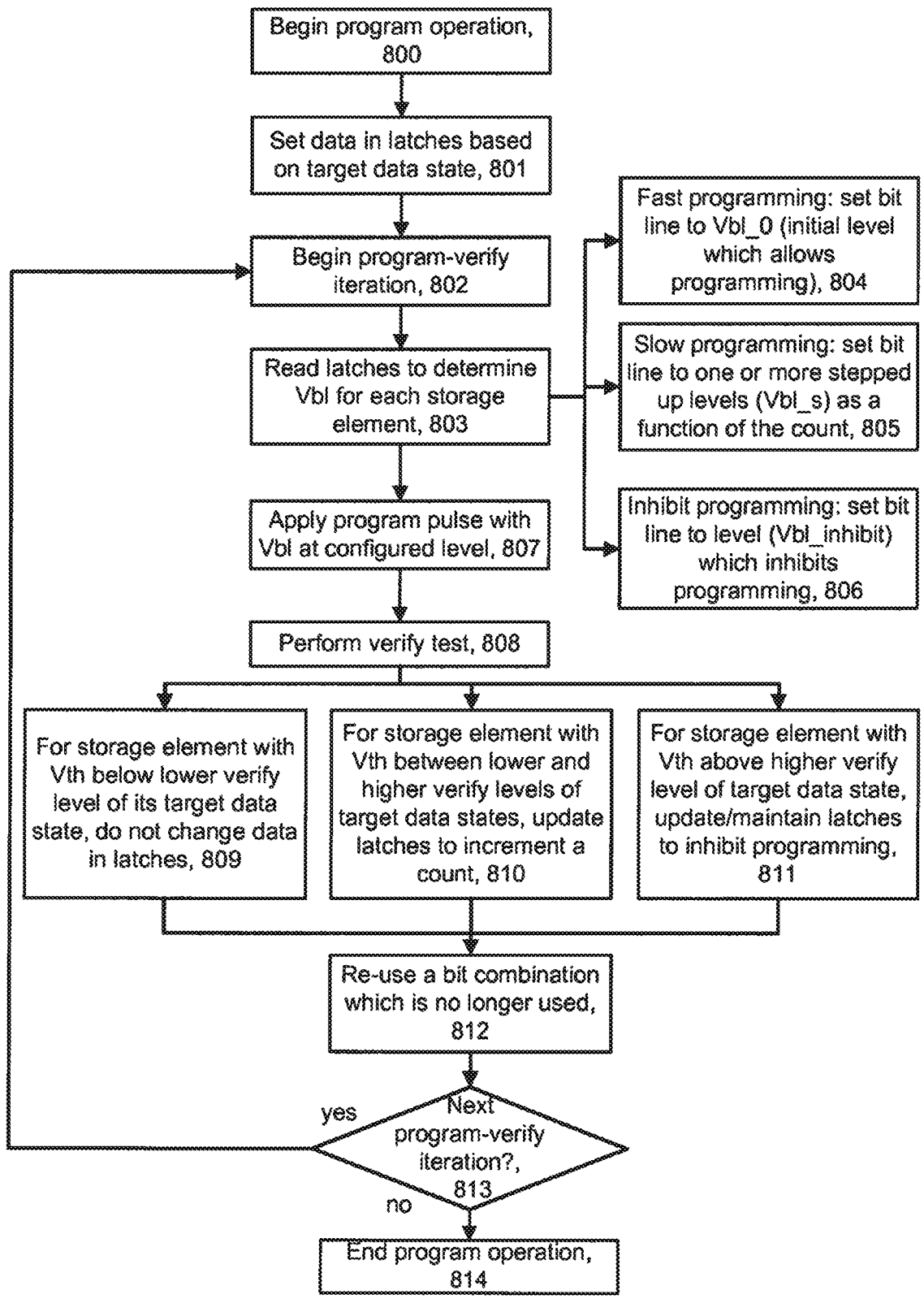
FIG. 8A depicts a program operation in which fast and slow programming modes are used, and a bit line voltage is used in the slow programming mode as a function of a count of program pulses in the slow programming mode according to aspects of the disclosure.
Figure 8B:
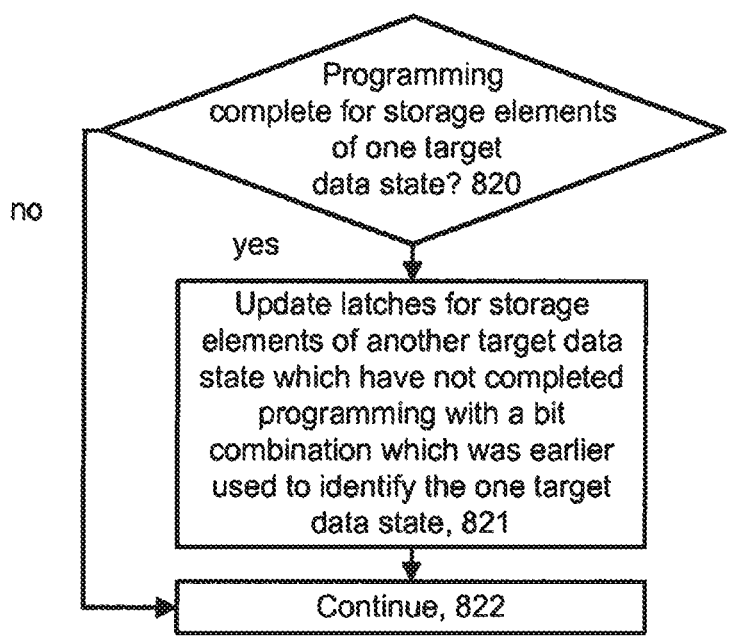
Figure 8C:
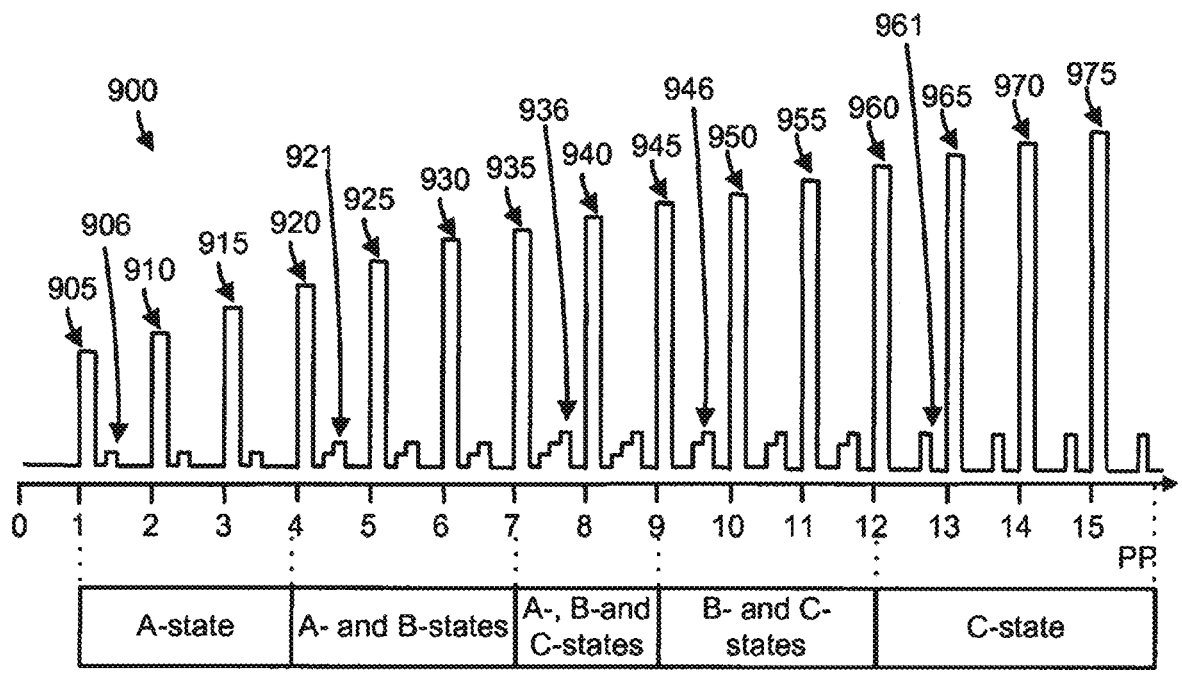
Figure 9:
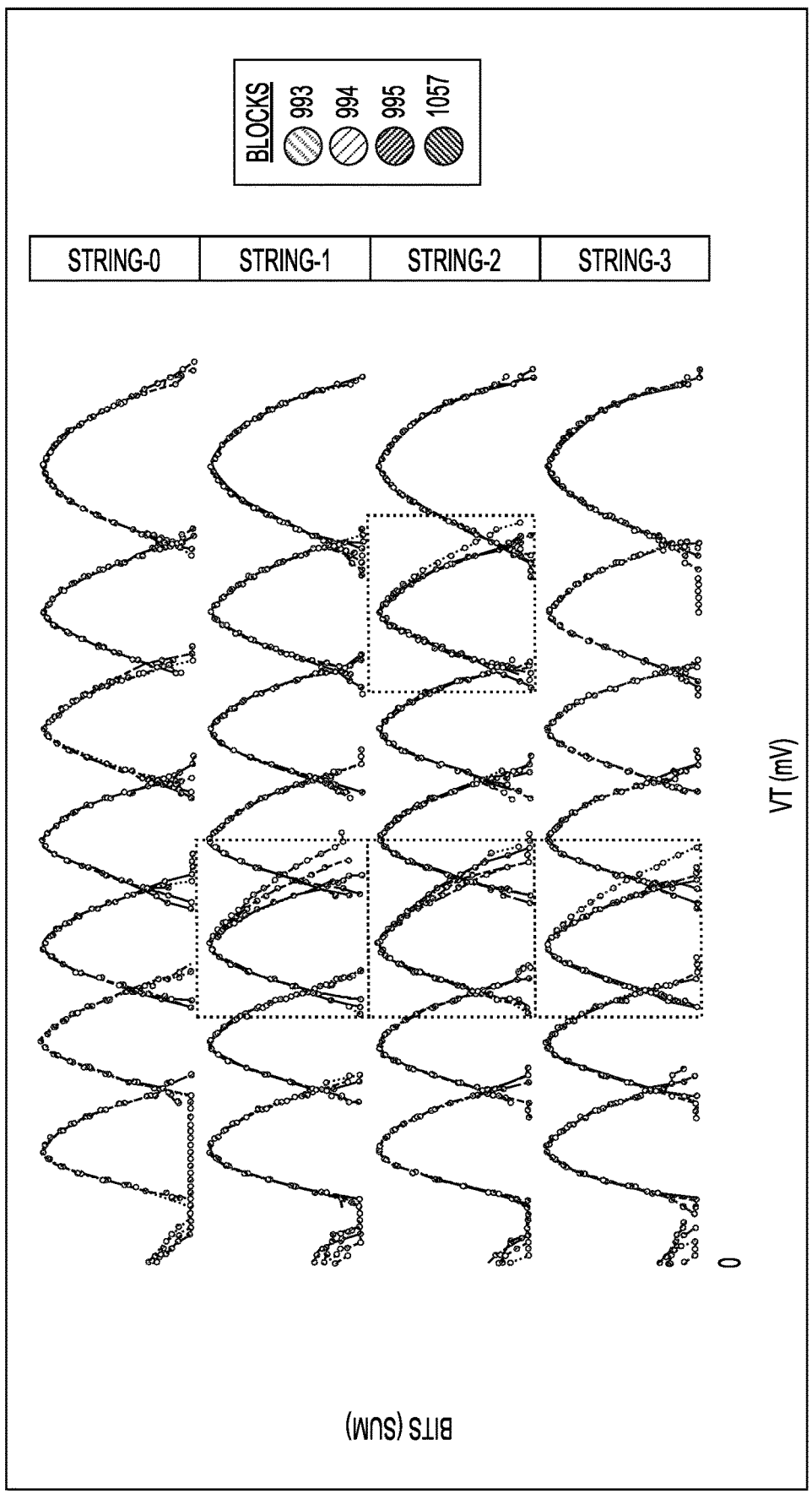
Figure 10:
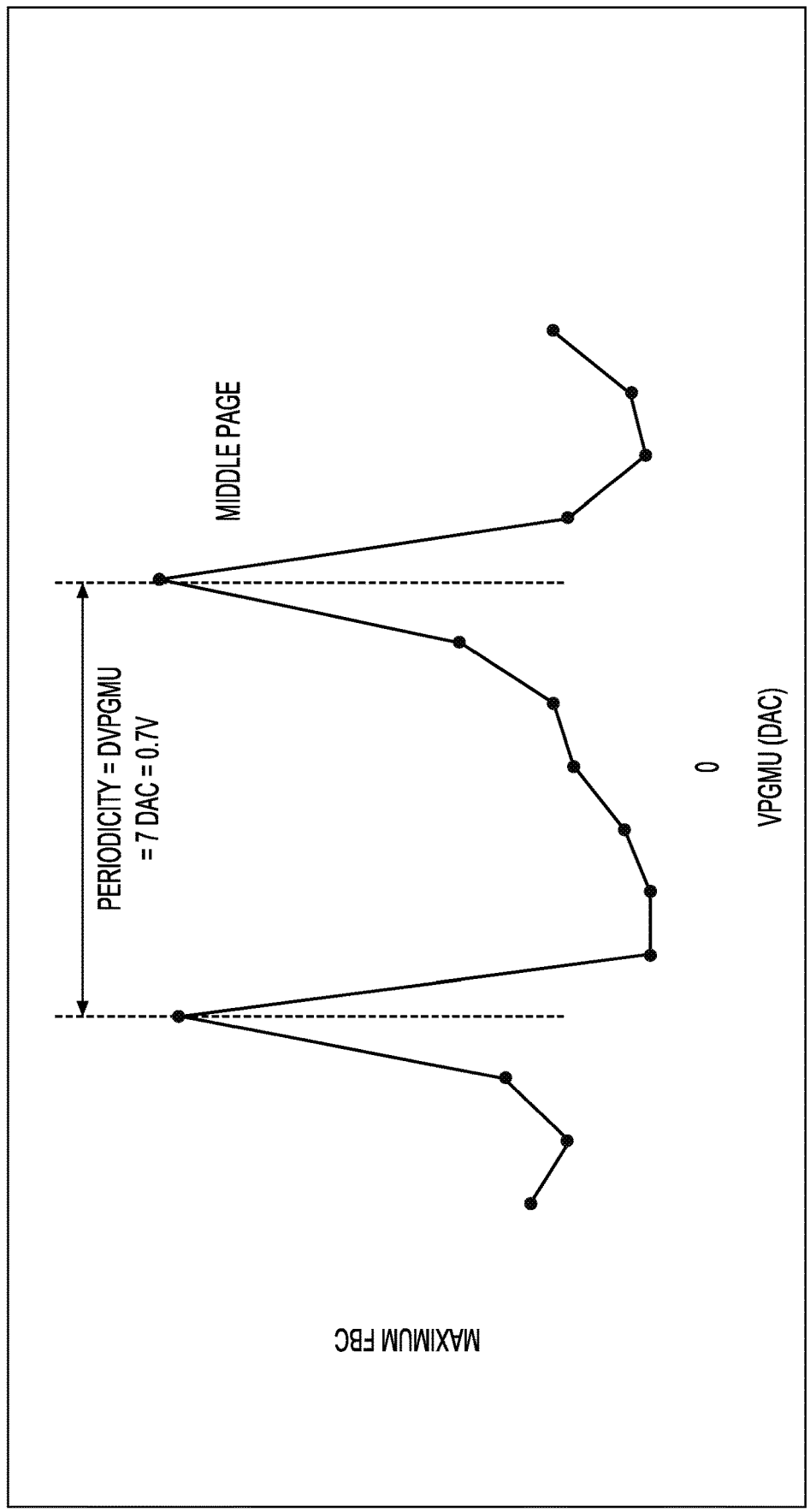
Figure 11:
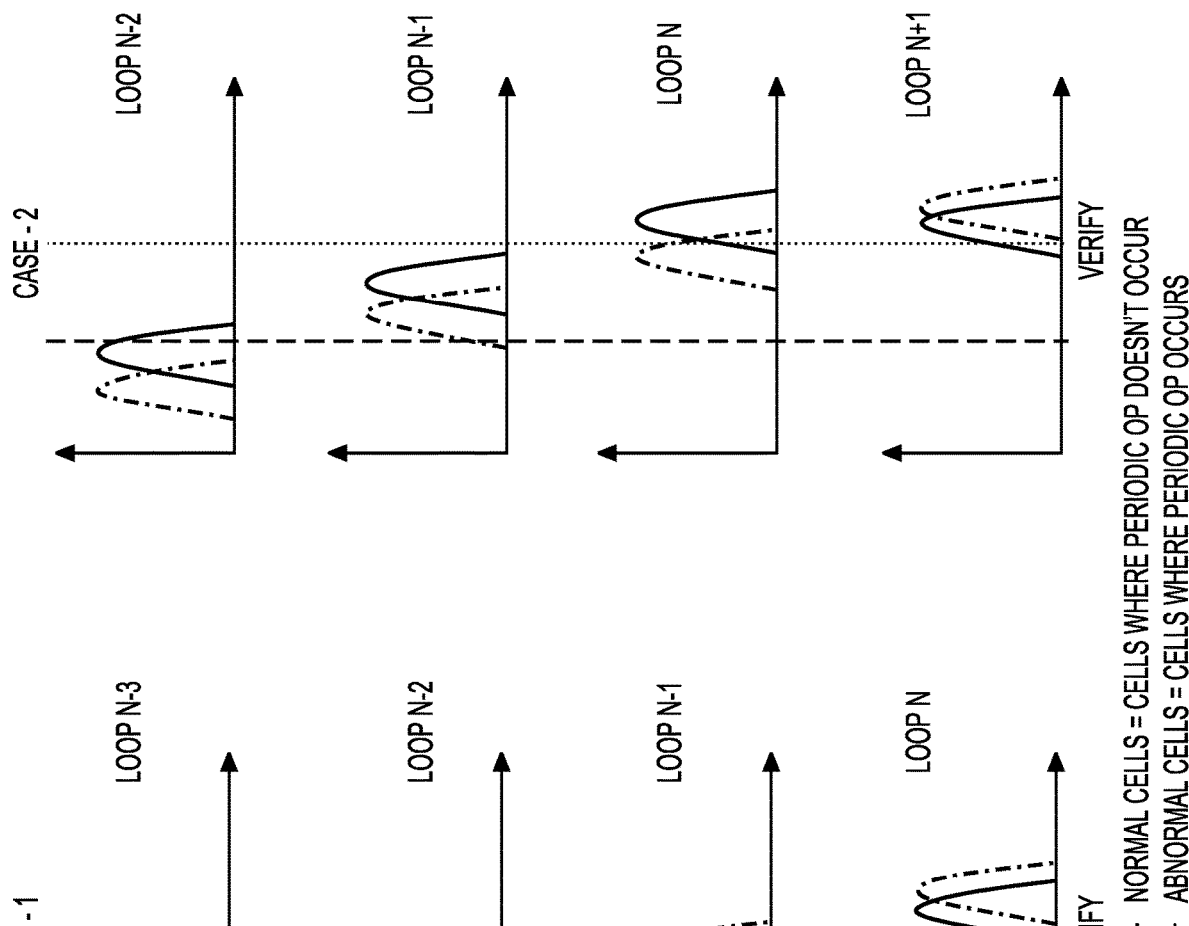
Figure 12:
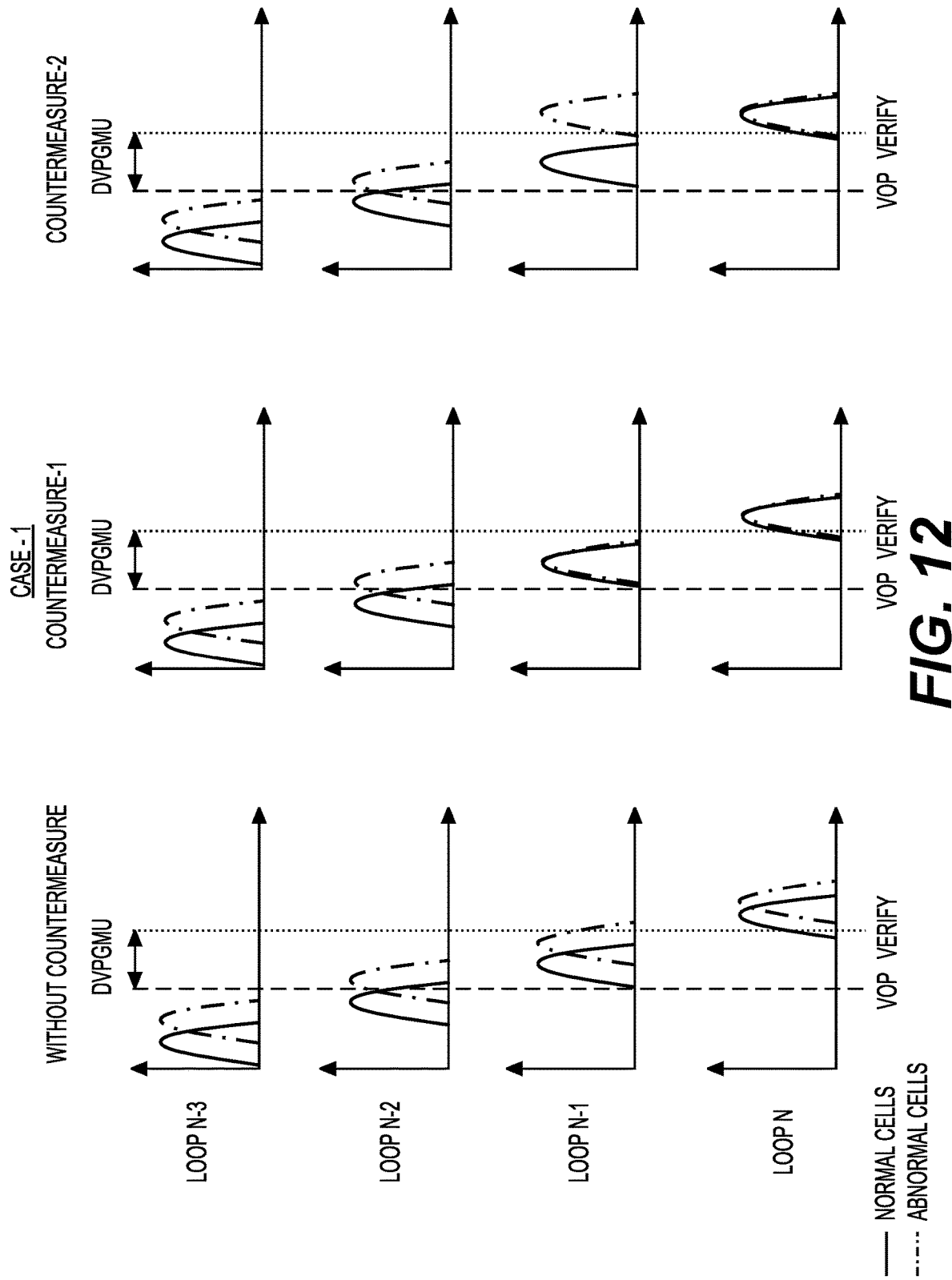
Figure 13:
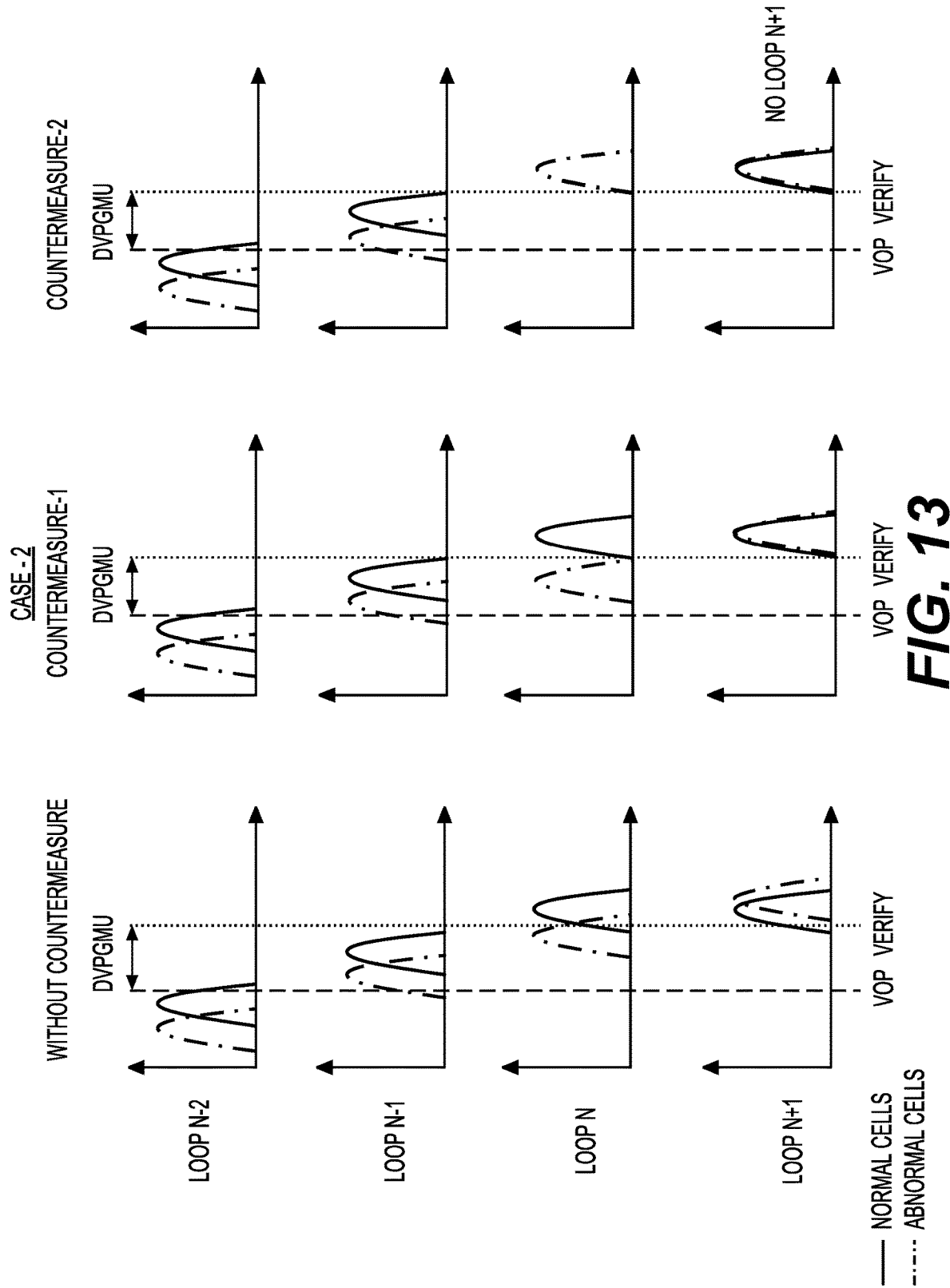
Figure 14:
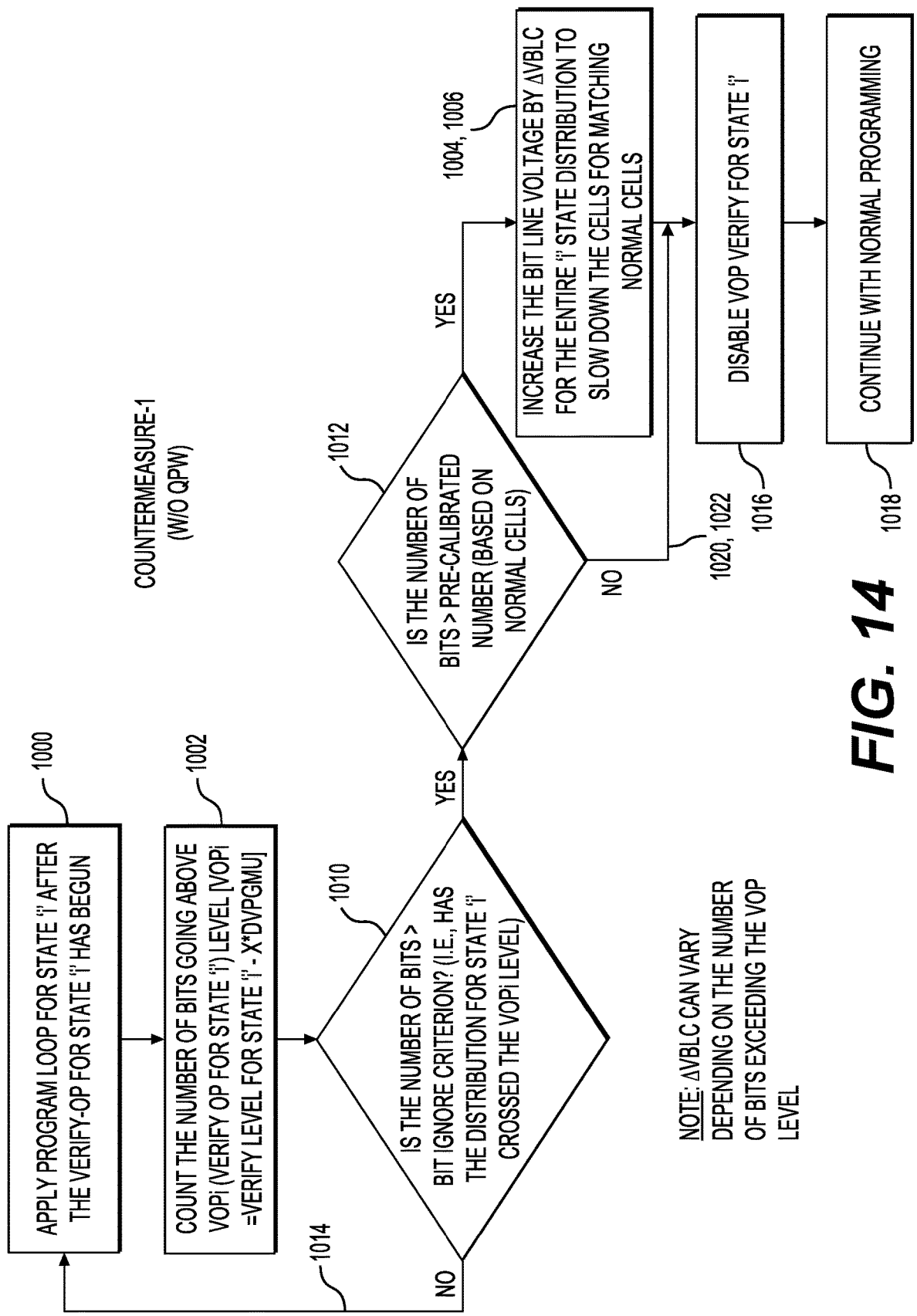
Figure 15:
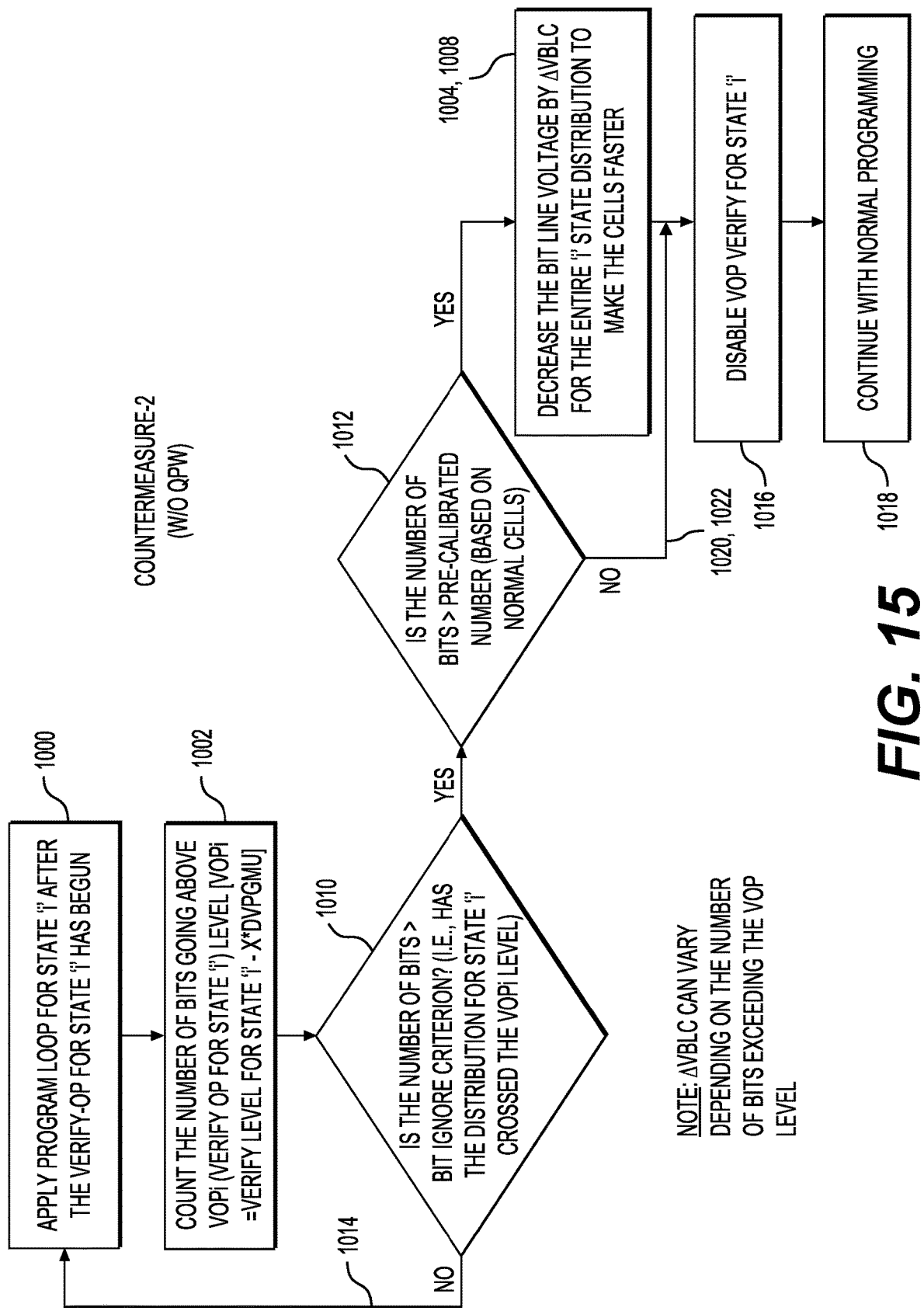
Figure 16:
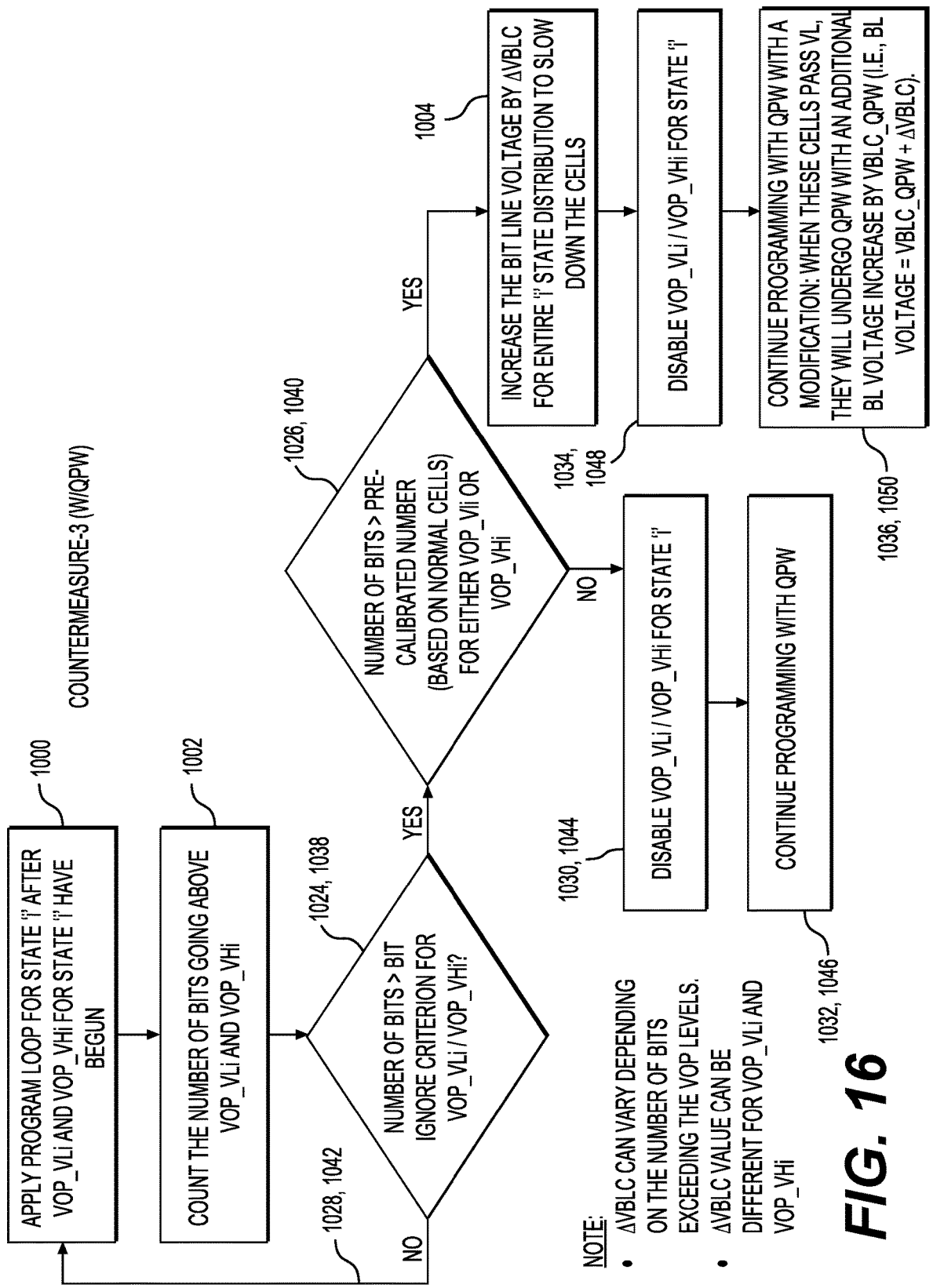

FIG. 8B provides example details regarding step 812 of FIG. 8A in which a bit combination is re-used in data latches to provide an additional count of program pulses in the slow programming mode according to aspects of the disclosure;

FIG. 8C depicts a program operation in which verify operations are performed for different target data states as the program operation progresses, and where a bit combination can be re-used according to the programming progress according to aspects of the disclosure;

FIG. 9 shows threshold voltage distributions for multiple strings and multiple blocks of an example memory apparatus according to aspects of the disclosure;

FIG. 10 shows a plot of a maximum failure bit count versus a programming voltage according to aspects of the disclosure;

FIG. 11 shows example threshold voltage distributions for multiple loops of a program operation illustrating two broad cases when periodic over programming occurs according to aspects of the disclosure;

FIGS. 12 and 13 show example threshold voltage distributions for multiple loops of a program operation illustrating the two broad cases shown in FIG. 11 when periodic over programming occurs according to aspects of the disclosure; and FIGS. 14-16 illustrate steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

During program operations, there is a tradeoff between reducing programming time and achieving narrow threshold voltage (Vth) distributions for the different data states. Programming speed can be increased by using a larger program pulse step size. However, this results in large overshoots past the verify level, causing a wide Vth distribution. On the other hand, if a smaller program pulse step size is used, a narrow Vth distribution is achieved at the cost of increased programming time. Another approach is to verify the storage elements at two separate verify levels for each target data state. Before the Vth of a storage element reaches a lower verify level (VL) of its target data state, its bit line voltage (Vbl) is set to a low level such as 0 V to cause the storage element to have a relatively fast programming speed. When the Vth of the storage element exceeds the lower verify level, its Vbl is set to an intermediate level to cause the storage element to have a relatively slow programming speed. When the Vth of the storage element exceeds a higher verify level (VH) of its target data state, its Vbl is set to a high level to inhibit (lockout) programming of the storage element.

Moreover, with Vbl=0 V, the Vth of a storage element increases with each program pulse by an amount which is roughly equal to a step size of the program pulse. With the intermediate Vbl, the Vth of a storage element increases with each program pulse by an amount which is less than the step size of the program pulse. The distance between the lower and higher verify levels for each state can be optimized on silicon and set to the point at which the Vth distributions are narrowest.

At a certain program pulse, even though the Vth of a majority of the storage elements jumps by an amount which is roughly equal to the program pulse step size during a program operation, there can be storage elements for which the threshold voltage Vth jump is higher or lower than the average jump. As a result, the program speed differs for different storage elements and is difficult to optimize for a set of storage elements.

Figure 1:
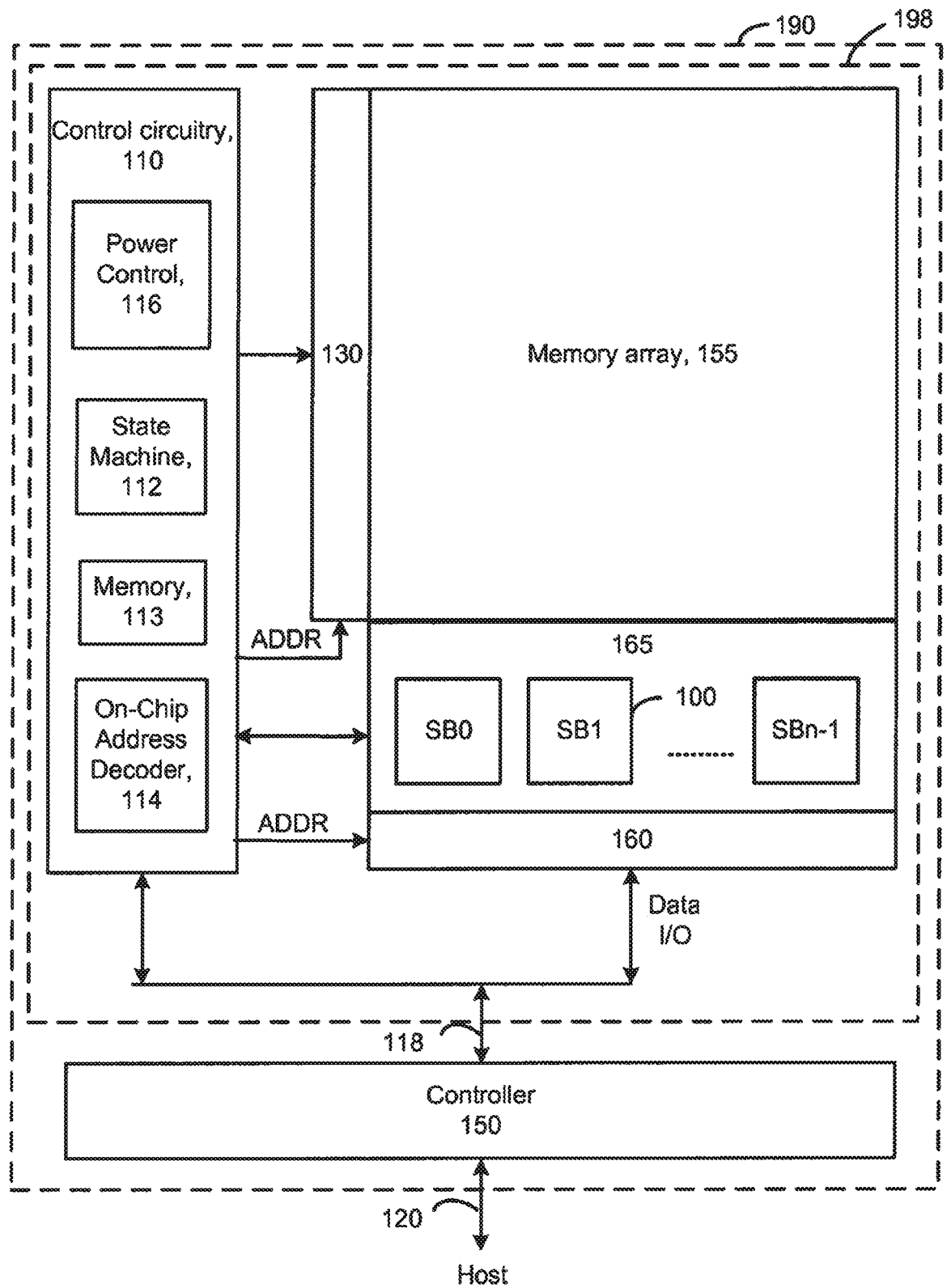
FIG. 1 is a block diagram of a non-volatile memory system using single row/column decoders and read/write circuits according to aspects of the disclosure.

FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 and managing circuit MC0 in FIG. 3A), read/write circuits 165, and controller 150, and so forth. The sense block 100 is discussed further in connection with FIG. 3A.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
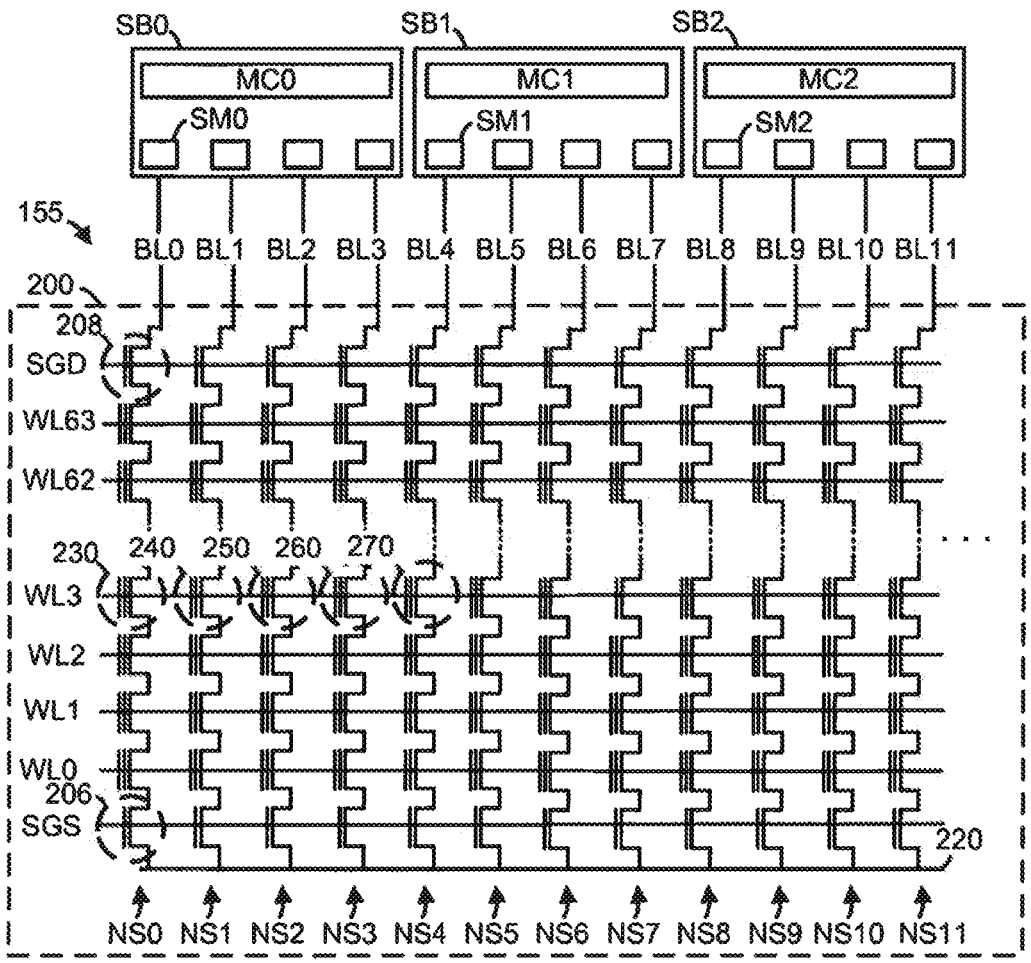
FIG. 2A depicts a block of NAND flash memory cells in the memory array of FIG. 1 and associated sense blocks SB0, SB1 and SB2 according to aspects of the disclosure.

FIG. 2A depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 220. For example, NS0 includes a source side select gate transistor 206 and a drain side select gate transistor 208. Example storage elements 230, 240, 250, 260 and 270 are in NS0 to NS4, respectively, and are connected to WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3A.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
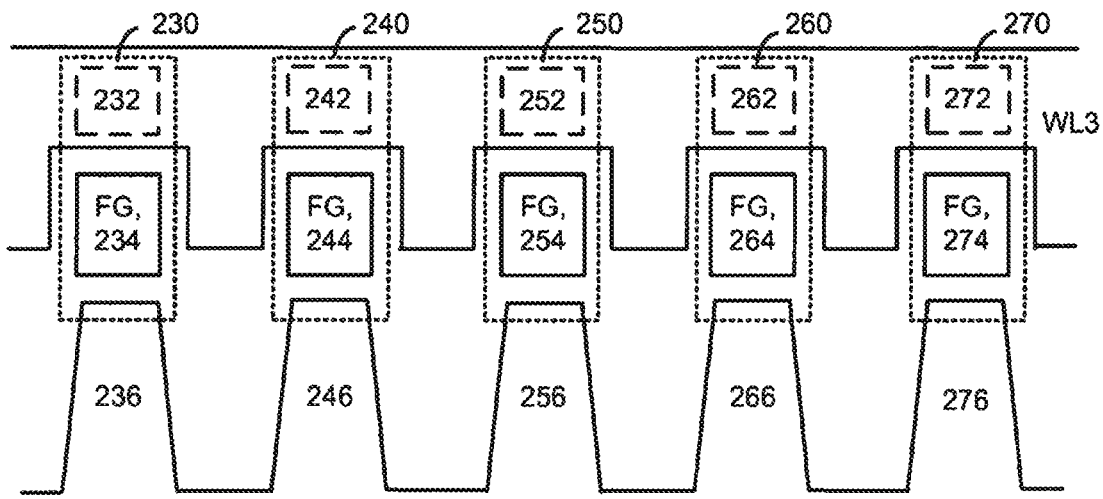
FIG. 2B depicts a cross-sectional view of the NAND strings of FIG. 2A according to aspects of the disclosure.

FIG. 2B depicts a cross-sectional view of the NAND strings of FIG. 2A. A bit line or NAND string direction goes into the page, and a word line direction goes from left to right. As an example, WL3 extends across NAND strings NS0 to NS4 which include respective channel regions 236, 246, 256, 266 and 276. The storage element 230 in NS0 includes a control gate 232, a floating gate 234 and the channel region 236. The storage element 240 in NS1 includes a control gate 242, a floating gate 244 and the channel region 246. The storage element 250 in NS2 includes a control gate 252, a floating gate 254 and the channel region 256. The storage element 260 in NS3 includes a control gate 262, a floating gate 264 and the channel region 266. The storage element 270 in NS4 includes a control gate 272, a floating gate 274 and the channel region 276.

Figure 3A:
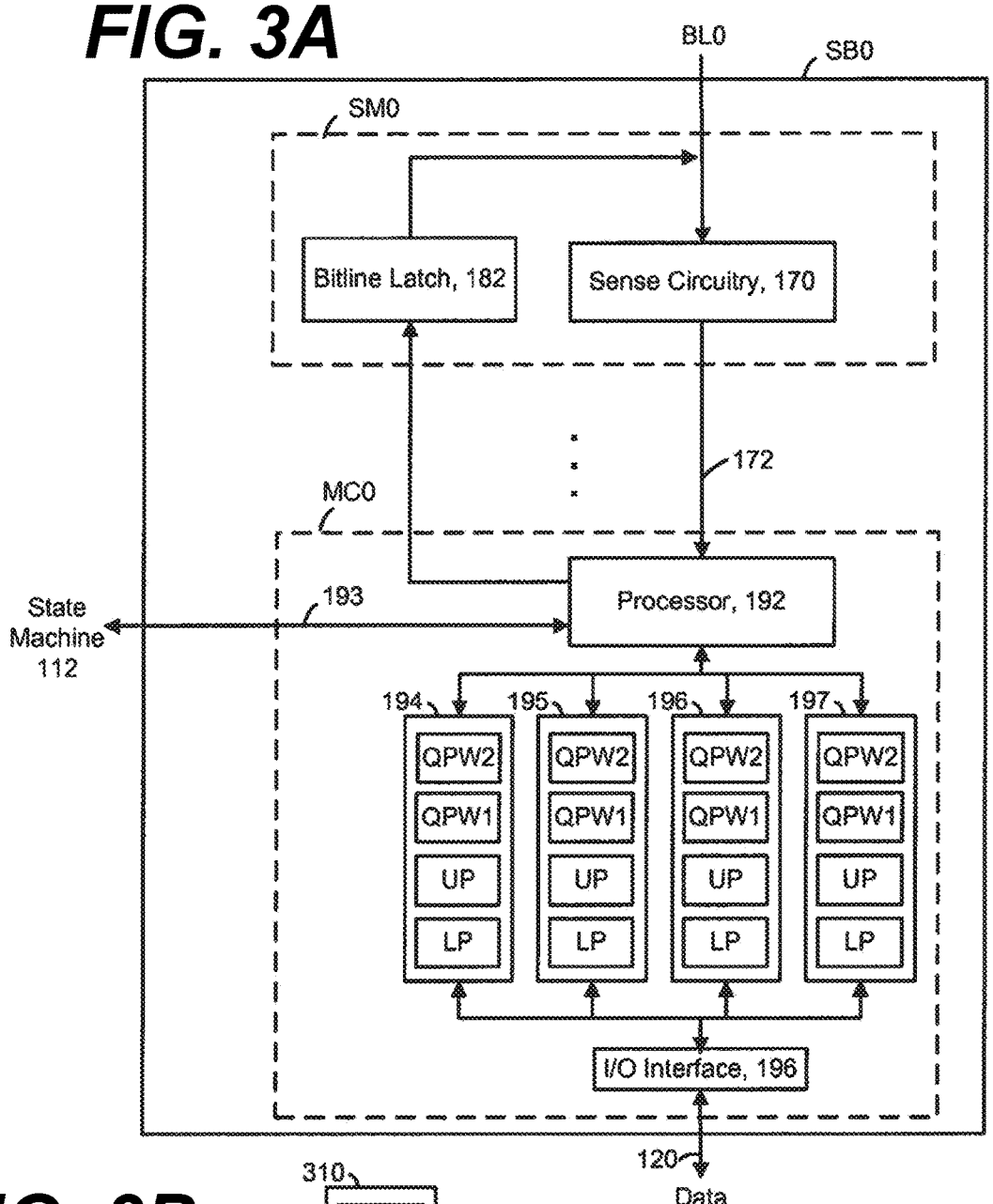
FIG. 3A is a block diagram depicting one embodiment of the sense block SB0 of FIG. 1 according to aspects of the disclosure.

FIG. 3A is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming. Further details of an example sense module are provided in FIGS. 18A to 18C.

Managing circuit MC0 comprises a processor 192, four example sets of data latches 194-197 and an I/O Interface 196 coupled between the set of data latches 194 and data bus 120. One set of data latches can be provide for each sense module, and data latches identified by LP, UP, QPW1 and QPW2 may be provided for each set. In some cases, additional data latches may be used. In other cases, fewer data latches may be used. LP stores a bit for a lower page of data, and UP stores a bit for an upper page of data. This is in a four-level or two-bits per storage element memory device. In each set of latches, one or more additional data latches, each storing one bit of data, can be provided to maintain a count of program pulses which are applied to the storage element when its Vth is between the lower and higher verify levels, e.g., when the storage element experiences slow programming. In this example, two additional data latches QPW1 and QPW2 are depicted.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP latches, in a two-bit per storage element implementation. In a three-bit per storage element implementation, one extra data latch MP may be used, to store the middle page data. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
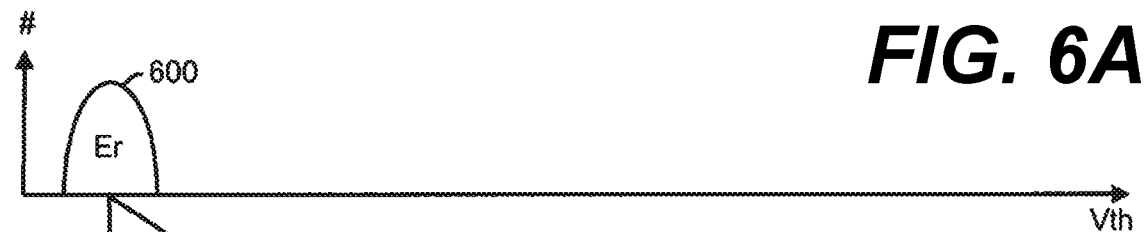
FIGS. 6A to 6D depict a three pass program operation with fast and slow programming modes used on the third pass according to aspects of the disclosure.
Figure 6B:
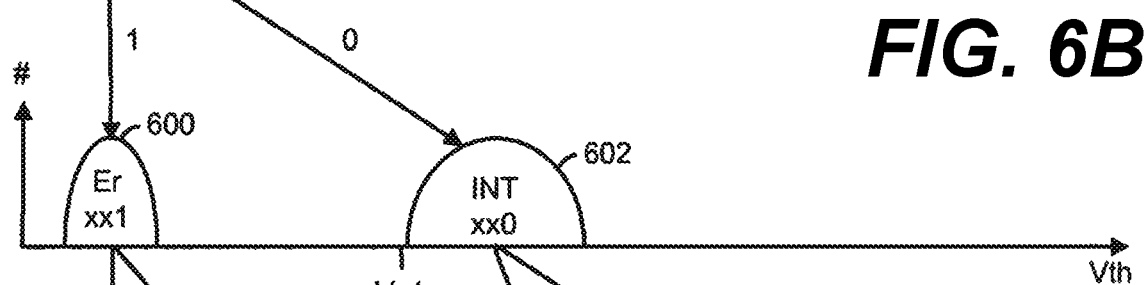
Figure 6C:
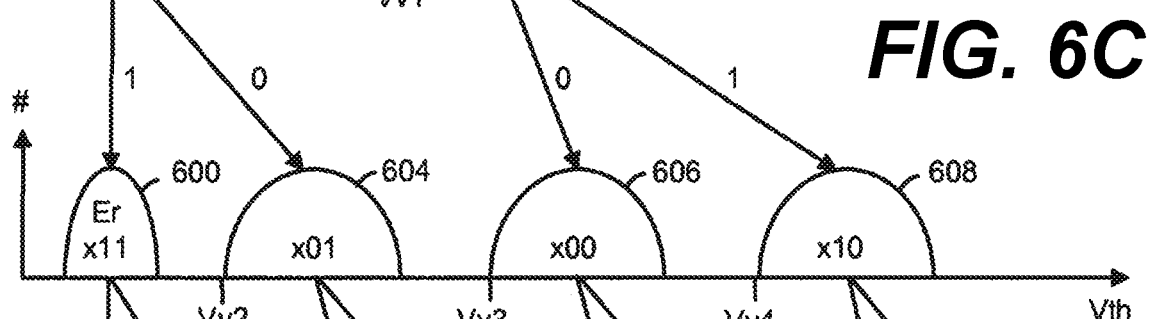

The data latches identify when an associated storage element has reached certain mileposts in a program operation. For example, latches may identify that the Vth of a storage element is below a particular verify level. The data latches indicate whether a storage element currently stores one or more bits from a page of data. For example, the LP latches can be used to store a lower page of data. An LP latch is flipped (e.g., from 0 to 1) when a lower page bit is stored in an associated storage element. The UP latches can be used to store an upper page of data, for instance. An UP latch is flipped when an upper page bit is stored in an associated storage element. The flipping of a bit occurs when an associated storage element completes programming, e.g., when its Vth exceeds a target verify level such as VvaH, VvbH or VvcH. When lower, middle and upper page bits are used (e.g., in case of three-bit per storage element memory), they are stored in latches referred to as LP, MP and UP, respectively. MP is flipped when a middle page bit is stored in an associated storage element, and UP is flipped when an upper page bit is stored in an associated storage element. For example, in FIG. 6B to 6D, the first bit (from right to left) is the lower page bit, the second bit is the middle page bit and the third bit is the upper page bit.

Figure 3B:
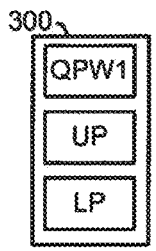
FIG. 3B is a block diagram depicting a set of three data latches as an alternative to the set of four data latches depicted in FIG. 3A according to aspects of the disclosure.

FIG. 3B is a block diagram depicting a set of three data latches as an alternative to the set of four data latches depicted in FIG. 3A. The set 300 includes latches LP, UP and QPW1.

Figure 3C:
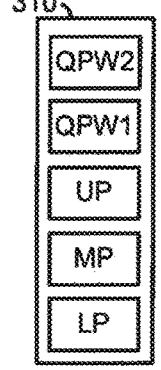
FIG. 3C is a block diagram depicting a set of five data latches as an alternative to the set of four data latches depicted in FIG. 3A according to aspects of the disclosure.

FIG. 3C is a block diagram depicting a set of five data latches as an alternative to the set of four data latches depicted in FIG. 3A. The set 310 includes latches LP, MP, UP, QPW1 and QPW2.

Figure 3D:
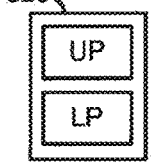
FIG. 3D is a block diagram depicting a set of two data latches as an alternative to the sets of four data latches depicted in FIG. 3A according to aspects of the disclosure.

FIG. 3D is a block diagram depicting a set of two data latches as an alternative to the sets of four data latches depicted in FIG. 3A. The set 320 includes latches LP and UP.

FIGS. 4A and 4B depict a one pass program operation with fast and slow programming modes. One pass programming is also referred to as "one-pass write" programming. A programming pass is generally meant to encompass a sequence of multiple program-verify operations which are performed starting from an initial Vpg level and proceeding to a final Vpg level until the threshold voltages of a set of selected storage elements reach one or more respective verify levels of respective target data states. In one pass programming, all storage elements are initially in an erased state. Some of the storage elements are not programmed and remain in the erased state while others are programmed to higher target data states.

Example Vth distributions for the storage element array are provided for a case where each storage element stores two bits of data. Each graph depicts Vth on the horizontal axis and a number or population of storage elements in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state storage elements. Three Vth distributions 404, 406 and 408 represent target data states A, B and C, respectively, which are reached by storage elements when their Vth exceeds a higher verify level VvaH, VvbH or VvcH, respectively. In this case, each storage element can store two bits of data in one of four possible Vth ranges, referred to as states Er, A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvaL, VvbL or VvcL) are defined such that the storage elements enter a slow down programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a storage element exceeds the lower verify level associated with the target data state of the storage element, a slow programming mode begins for the storage element. Subsequently, when a verify test determines that the Vth of a storage element exceeds the higher verify level associated with the target data state of the storage element, the storage element is locked out from further programming.

In some cases, QPW is used on fewer than all target data states. For example, a wider Vth distribution may be acceptable for the highest data state (e.g., the C state in this example). Total programming time may be reduced by avoiding the use of QPW with the highest data state, since the time spent in sensing whether the Vth exceeds VvcL can be avoided. Generally, QPW can be used for selected target data states based on testing which identifies the target data states for which QPW yields the most benefit.

The specific relationship between the data programmed into a storage element and the Vth level of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B and C state. Read reference voltages which are between the distributions are used for reading data from the storage elements. By testing whether the Vth of a given storage element is above or below one or more of the read reference voltages, the system can determine the data state which is represented by a storage element.

FIGS. 5A to 5C depict a two pass program operation with fast and slow programming modes used on the second pass, and only fast programming mode used on the first pass. Each pass can be used to program a page of data. For example, programming of lower and upper pages in two-bit, four-level storage elements is provided. Programming can be performed one logical page at a time, with the lower page followed by the upper page. Initially, all storage elements are in the Er state, represented by the distribution 500 in FIG. 5A.

FIG. 5B depicts programming of a lower page of data. If the lower page has a bit=1, the associated storage element remains in the distribution 500 and the data is represented by x1, where x is an upper page bit that is not yet known. If the lower page has a bit=0, the storage element is programmed to a higher Vth as represented by distribution 502, which is an interim distribution (INT), using a verify level Vv1. The data of these storage elements is represented by x0. Note that the interim distribution can be relatively wide since it is not a final distribution and does not represent a final data state.

FIG. 5C depicts programming of an upper page of data. If UP/LP=11, the associated storage element in the distribution 500 remains in the distribution 500 and stores data bits 11. If UP/LP=01, the storage elements in the distribution 500 are programmed to the distribution 504 (state A) and a slow down programming mode is used when the Vth is between VvaL VvaH. If UP/LP=10, the storage elements in the distribution 502 are programmed to the distribution 508 (state C) and a slow down programming mode is used when the Vth is between VvcL and VvcH. If UP/LP=00, the storage elements in the distribution 502 are programmed to the distribution 506 (state B) and a slow down programming mode is used when the Vth is between VvbL and VvbH.

Programming can be similarly extended to three or more bits per storage element. For example, FIGS. 6A to 6D depict a three pass program operation with fast and slow programming modes used on the third pass. Programming of lower, middle and upper pages in three-bit, eight-level storage elements is depicted. Seven programmed data states A through G are used in addition to Er for eight states total. Initially, all storage elements are in the Er state, represented by the distribution 600. The lower page is programmed in FIG. 6B. If LP=1, storage elements in distribution 600 remain in that distribution. If LP=0, storage elements in distribution 600 are programmed to an interim distribution 602 using Vv1. The middle page is programmed in FIG. 6C. If MP=1, storage elements in distribution 600 remain in that distribution, and storage elements in distribution 602 are programmed to interim distribution 608 using verify level Vv4. If MP=0, storage elements in distribution 600 are programmed to interim distribution 604 using verify level Vv2, and storage elements in distribution 602 are programmed to interim distribution 606 using verify level Vv3.

Figure 6D:
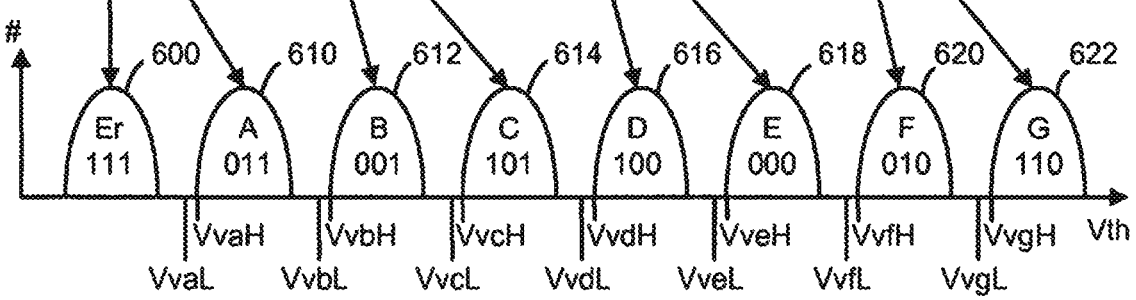

The upper page is programmed in FIG. 6D. QPW is used for this pass. If UP=1, storage elements in distribution 600 remain in that distribution, storage elements in distribution 604 are programmed to distribution 614 (state C), storage elements in distribution 606 are programmed to distribution 616 (state D), and storage elements in distribution 608 are programmed to distribution 622 (state G). If UP=0, storage elements in distribution 600 are programmed to distribution 610 (state A), storage elements in distribution 604 are programmed to distribution 612 (state B), storage elements in distribution 606 are programmed to distribution 618 (state E), and storage elements in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

Figure 7A:
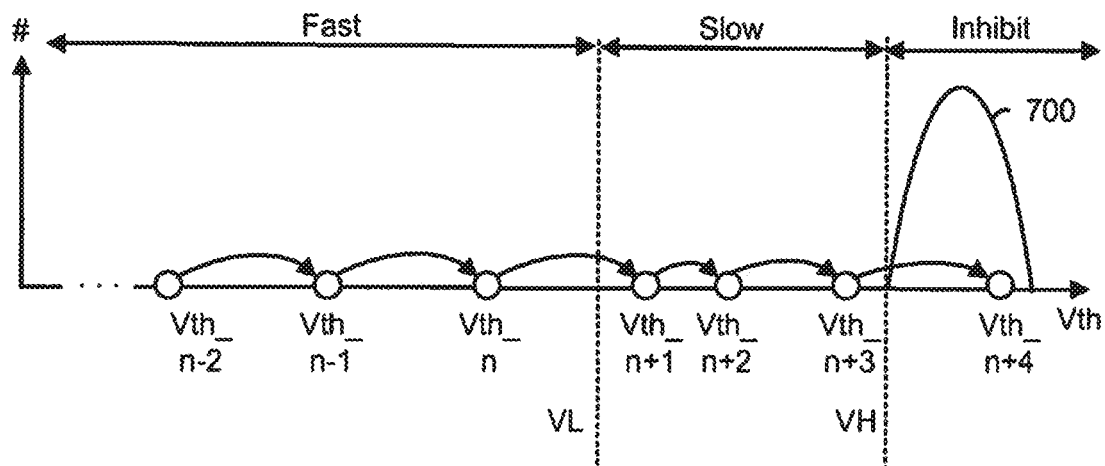
FIG. 7A depicts a progress of a Vth of a storage element in a program operation where fast and slow programming modes are used, as a result of the program voltage depicted in FIG. 7B and the bit line voltage depicted in 7C, where a single bit line voltage is used during the slow programming mode according to aspects of the disclosure.
Figure 7B:
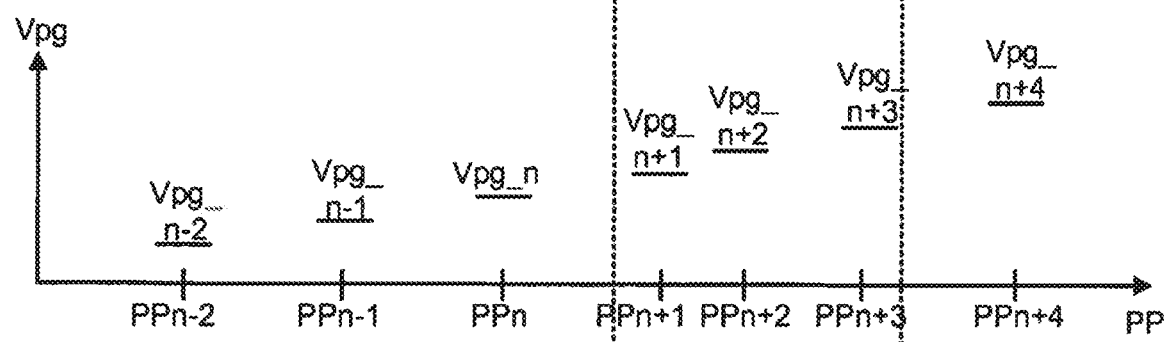
Figure 7C:
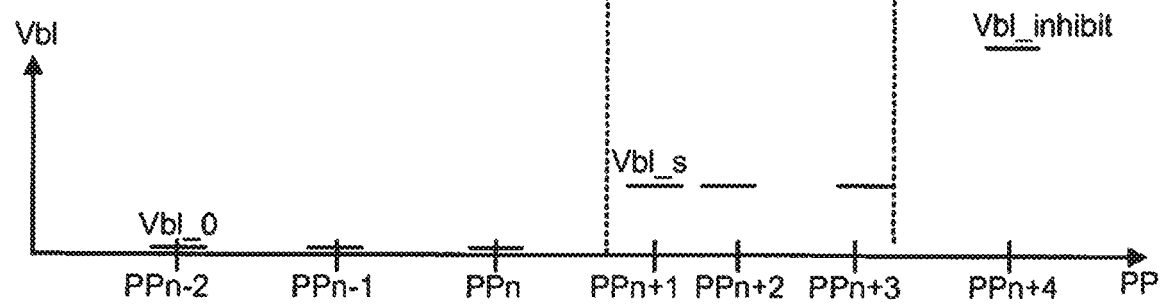

FIG. 7A depicts a progress of a Vth of a storage element in a program operation where fast and slow programming modes are used, as a result of the program voltage depicted in FIG. 7B and the bit line voltage depicted in 7C, where a single Vbl is used during the slow programming mode. The horizontal axis depicts Vth and the vertical axis depicts a number of cells in the Vth distribution 700. The circles depict the Vth of a storage element when a corresponding program pulse and bit line voltage are applied. A fast programming zone (Fast), slow programming zone (Slow) and inhibit zone (Inhibit) are depicted. In FIG. 7B, the horizontal axis depicts a program pulse number and the vertical axis depicts a corresponding program voltage Vpg. In FIG. 7C, the horizontal axis depicts the program pulse number and the vertical axis depicts a corresponding bit line voltage Vbl.

The fast programming mode is represented by program pulses PPn−2 through PPn, when program voltages Vpg_n−2 through Vpg_n and bit line voltage Vbl−0 (e.g., 0 V) are applied. PPn is the programming pulse which causes the Vth to increase above VL (e.g., from Vth_n to Vth_n+1). Generally, one or more initial program pulses (e.g., PPn−2 to PPn) are applied in the fast programming mode, and one or more additional program pulses (e.g., PPn+1 to PPn+3) are applied in the slow programming mode. Further program pulses such as PPn+4 are applied in the inhibit zone.

In the slow programming mode, program voltages Vpg_n+1 through Vpg_n+3 and bit line voltage Vbl_s (e.g., 0.6 V) are applied, causing the Vth to increase to Vth_n+2 through Vth_n+4, respectively. In the inhibit mode, a program pulse PPn+4 is applied using program voltage Vpg_n+4 and bit line voltage Vbl_inhibit (e.g., 2.5 V), causing no change in the Vth. PPn+3 is the programming pulse which causes the Vth to increase above VH (e.g., from Vth_n+3 to Vth_n+4). Vbl_s is the single bit line voltage which is used during the slow programming mode.

As discussed, the slow programming mode helps to tighten the programmed Vth distributions. In one approach, the slow programming mode can be used for all states except the highest programmed state. For example, it can be used for the NB states but not the C state when there are four data states, and for the A/B/C/D/E/F-states but not the G state when there are eight data states. Under the slow programming mode, verify tests are performed at Verify_Low (VL) and Verify_High (VH) during programming. VH is the higher or final verify level for a respective data state. Based on the Vth level of a storage element with respect to VL and VH, the bit line associated with the storage element can be biased at different levels to modulate the program speed of the storage element. If Vth<VL, the associated Vbl is set to 0 V, for instance, leading to a normal (fast) program speed. The Vth increases by roughly equal increments in the fast programming mode as represented by Vth_n−1-Vth_n−2, Vth_n-Vth_n−1 and Vth_n+1-Vth_n. Once the Vth of the storage element reaches in between VL and VH (VL<Vth<VH), the associated Vbl is raised to a slow programming level such as 0.6 V to slow down the programming. The storage element takes much smaller Vth jumps in the slow programming mode. The Vth increases by increments as represented by Vth_n+2-Vth_n+1, Vth_n+3-Vth_n+2 and Vth_n+4-Vth_n+3 in the slow programming mode. When Vth>VH for the storage element, it is locked out by setting Vbl to a power supply voltage Vdd (~2.5 V). This high Vbl inhibits the storage element from further programming during subsequent program pulses which are applied to the selected word line.

The process depicted occurs separately for each of the selected storage elements. For example, the number of program pulses (PPn) required to reach the slow programming mode can be different for different storage elements.

An optimum exists for the gap between VL and VH at which the programmed Vth distributions are tightest. To understand why, consider that if the VL to VH gap is too small, the Vth of most storage elements jumps over the gap and hence the slow programming mode is bypassed. On the other hand, if the gap is too large, then multiple program pulses are needed to cause the Vth of the storage element to increase from VL to VH. Since the Vbl applied under the slow programming mode is fixed while Vpg is stepped up at the same pace by a step size ($\Delta$Vpg such as 0.4 V), the Vth jumps of a storage element under the slow programming mode gradually increase, approaching the steady state Vth jumps ($\Delta$Vt=$\Delta$Vpg). For example the jump from Vth_n+1 to Vth_n+2 may be smallest, while the jump from Vth_n+2 to Vth_n+3 is larger and the jump from Vth_n+3 to Vth_n+4 may be largest, similar to the steady state Vth jumps in the fast programming mode (e.g., jumps from Vth_n-2 to Vth_n-1, Vth_n-1 to Vth_n and Vth_n to Vth_n+1).

As a result, a storage element for which the Vth reaches VH after one program pulse within the slow programming mode will advantageously arrive in the inhibit zone with a smaller $\Delta$Vth as compared to a storage element that spent more than one program pulse within the slow programming mode. Note that the width of the final Vth distribution 700 is affected by the last Vth jump that the storage element takes in the slow programming mode, just before crossing the VH level. As the VL to VH gap increases, the probability that a storage element receives more than one program pulse in the slow programming mode increases, and hence the benefit of the slow programming mode is reduced.

The number of program pulses which a storage element receives in the slow programming mode can vary. For example, due to a natural variation in the program speed from storage element to storage element, different storage elements arrive in the slow programming mode at different Vth levels. Some storage elements may enter the slow programming mode with a Vth just above VL, while other storage elements may enter the slow programming mode with a Vth just below VH. Thus, the increase in Vth which is required for different storage elements in the slow programming mode to reach the inhibit zone can vary, which in turn means a different number of program pulses are applied to different storage elements in the slow programming mode. Moreover, even if different storage elements enter the slow programming mode at the same Vth, the size of the Vth jumps for the different storage elements in the slow programming mode can vary due to program noise. Program noise causes storage elements to deviate away from uniform Vth jumps due to quantum mechanical fluctuations. As a result, there is a measurable spread in $\Delta$Vth over a population of storage elements at a given program pulse.

As memory devices are scaled down, the problem of variations in program speed among different storage elements is expected to become worse. Thus, the problem of a variation in the number of program pulses applied to different storage elements in the slow programming mode is expected to become worse, reducing the effectiveness of the slow programming mode. A proposal described next uses a dynamic bit line bias for storage elements in the slow programming mode.

FIG. 8A depicts a program operation in which fast and slow programming modes are used, and different bit line voltages are used in the slow programming mode as a function of a count of program pulses in the slow programming mode. In an example approach, during a first program pulse under the slow programming mode, Vbl will be at a relatively low level (e.g., 0.4 V) and will gradually be raised to relatively higher levels for subsequent program pulses that the storage element experiences while still in the slow programming mode. By tracking the number of program pulses applied to each storage element in the slow programming mode, and setting Vbl accordingly, the slow programming mode can be made more effective and relatively independent of the number of program pulses applied to each storage element in the slow programming mode. Overall, the effectiveness of the slow programming mode is improved, resulting in tighter Vth distributions.

A program operation begins at step 800. Step 801 sets data in latches associated with each storage element to be programmed based on a respective target data state of the storage element. For example, this can be data in the LP and UP latches of FIG. 3A, or in the LP, MP and UP latches of FIG. 3C. The data can be loaded in to the latches by the state machine 112, for instance. A program-verify iteration begins at step 802. Step 803 involves reading the latches to determine a Vbl to set for each storage element. In one option, at step 804, data in the latches indicates that fast programming is to be performed so that Vbl is set to Vbl-0 (e.g., 0 V), an initial level which allows programming. In another option, at step 805, data in the latches indicates that slow programming is to be performed so that Vbl is set to one or more stepped up levels (Vbl_s) as a function of a count of program pulses in the slow programming mode. The one or more stepped up levels allow programming. In another option, at step 806, data in the latches indicates that programming is to be inhibited so that Vbl is set to a level (Vbl_inhibit) which inhibits programming.

At step 807, a program pulse is applied to a selected word line with Vbl at the configured level for each selected storage element along the selected word line. At step 808, a verify test is performed for each selected storage element, e.g., using lower and higher verify levels associated with the different target data states. In one possible approach, the sensing to determine whether the Vth of a memory cell exceeds the lower verify voltage of its target data state can involve applying the lower verify voltage to the control gate of the memory cell via a word line and determining, after a specified sense time, whether a current through the memory cell and associated NAND string is greater than a reference current. The sense time and reference current can be the same when determining whether the Vth of a memory cell exceeds the higher verify voltage of its target data state. In this case, the higher verify voltage is applied to the control gate of the memory cell via the word line.

In another approach, the same control gate voltage is used to determine whether the Vth of a memory cell exceeds the lower or higher verify voltage. In this case, a sensing parameter such as sense time and/or reference current can be adjusted. For example, the higher verify voltage can be applied to the control gate of a memory cell to determine whether the Vth exceeds the lower verify voltage by using a shorter sense time and/or a lower reference current. In this example, the higher verify voltage can also be applied to the control gate of the memory cell to determine whether the Vth exceeds the higher verify voltage by using a longer sense time and/or a higher reference current. This approach avoids having to generate an additional control gate voltage for sensing the lower verify voltages.

One of three paths is followed for each storage element. In one path, at step 809, for a storage element with a Vth below the lower verify level of its target data state (fast programming mode), the data in the respective latches associated with the storage element is not changed. In a second path, at step 810, for a storage element with a Vth between the lower and higher verify levels of its target data state (slow programming mode), the data in the respective latches associated with the storage element is updated to increment a count. For example, a count may be initialized to zero and incremented to one when step 810 is performed the first time for a storage element. This indicates that the next program pulse will be the first program pulse that is applied to the storage element while in the slow programming mode. In a third path, at step 811, for a storage element with a Vth above the higher verify level of its target data state (inhibit mode), the data in the respective latches associated with the storage element is updated to inhibit programming during the next program pulse. The latches are updated to inhibit programming in the first pass through step 811 and maintained to inhibit programming in subsequent passes through step 811. Note that, once a storage element is inhibited, it is no longer sensed during subsequent program verify tests, since it has already been judged to be at its target Vth level.

Step 812 optionally re-uses a bit combination which is no longer used, to provide one or more additional values for a count of programming pulses in the slow programming mode. See FIG. 8B for further details. The bit combination is re-used from latches associated with a set of storage elements having one target data state which have completed programming, to latches associated with storage elements having another target data state which have not yet completed programming. At decision step 813, if there is a next program-verify iteration, the next program-verify iteration begins at step 802. Otherwise, the program operation ends at step 814.

FIG. 8B provides example details regarding step 812 of FIG. 8A in which a bit combination is re-used in data latches to provide an additional count of program pulses in the slow programming mode. Decision step 820 determines if programming is complete for storage elements of one target data state. This is a predetermined target data state which typically finishes programming sooner than other target data states. For example, in the program operation of FIGS. 4A and 4B, the A state would normally finish programming before the B and C states, and the B state would normally finish programming before the C state. See FIG. 8C, for instance, which indicates that the A state storage elements complete programming after the eight program-verify iterations so that the bit combination re-use can begin with the ninth program-verify iteration.

For the A state, for instance, the completion of programming can occur when the Vth of all, or a specified portion of the storage element whose target state is the A state, has been verified to exceed VvaH, the higher verify level for state A. A bit ignore criteria can be used so that programming is considered to be completed even if a small number (e.g., 1-10%) of the A state storage element have not passed the verify test using VvaH. If programming is not complete for the one target data state, a continue step 822 is reached. Step 813 in FIG. 8A is then reached. If programming is complete for the one target data state, step 821 updates latches for storage elements of another target data state (e.g., the B or C state) which have not completed programming with a bit combination which was earlier used to identify the one target data state, before the programming is complete for the one target data state.

By providing an additional count value in the slow programming mode, additional flexibility is obtained in setting Vbl as a function of the count, so that a narrow Vth distribution can be achieved. For example, the additional count value can be used to set an additional Vbl level which allows the Vth to be more precisely controlled. Or, the additional count value can be used to provide a different function of Vbl versus count which allows the Vth to be more precisely controlled. For instance, a new Vbl can be set when the count is four program pulses instead of three program pulses.

Note that when programming is complete for the A state, some portion of the B state storage elements may have already completed programming. As a result, the additional count value for the slow programming mode will be used only by the remaining B state storage elements for which the Vth has not yet reached the respective verify level of VvbH. However, benefits are still obtained since the Vth can be more precisely controlled for these remaining B state storage elements. Similar reasoning applies when the additional count value is provided for the C state storage elements. In practice, when programming is complete for the A state storage elements, fewer C state storage elements than B state storage elements will have completed programming, so that relatively more C state storage elements will benefit from the additional count value.

Many variations are possible with the re-use of bit combinations. For example, bit combinations from multiple target data states may be re-used when programming is completed for those multiple target data states. For example, a bit combination from the A state can be used for the B state when the A state completes programming, as mentioned. Further, a bit combination from the B state can be used for the C state when the B state completes programming. It is also possible for the bit combination from the A state to be used for the C state when the A state completes programming, and for the bit combination from the B state to be used for the C state when the B state completes programming. This would allow two additional count values for the C state.

In another approach, a bit combination can be re-used by storage elements of multiple target data states in a sequence. For instance, the bit combination from state A can be re-used for state B until a criterion is met, after which the bit combination from state A is re-used for state C and is no longer re-used by state B. In one approach, the criterion is a function of the programming progress of the B state storage elements. For example, the bit combination may be re-used for the B state until some portion of the B state storage elements has completed programming, or until a Vth of some portion of the B state storage elements is above or below a specified verify level. In another approach, the criterion is a specified number of program pulses. For example, the bit combination may be re-used for the B state for four program pulses, after which it is re-used for the C state storage elements.

Re-use of a bit combination by storage elements of multiple target data states provides the benefit of more precise control and flexibility to be shared by storage elements in the multiple target data states.

Generally, a bit combination is a sequence or string of two or more bits. The number of different bit combinations which can be stored in k latches is $2^k$. For example, in the example sets of latches of FIG. 3A, two latches (LP and UP) each store a bit of data in a first bit combination which identifies a target data state. For example, referring also to FIG. 4B, bit combinations 11, 01, 00 and 10 represent the E, A, B and C states, where the first bit in the bit combination represents the LP bit and the second bit in the bit combination represents the UP bit. A bit combination can be written with the lower page bit first followed by one or more higher page bits, or with the higher page bit first followed by one or more lower page bits.

Additionally, two latches (QPW1 and QPW2) each store a bit of data in a second bit combination which identifies a count of program pulses which are applied to a storage element. For example, bit combinations QPW1/QPW2=00, 01, 11, and 10 represent a count of 0, 1, 2 or 3, respectively.

In this approach, assume one storage element (e.g., 230 in FIG. 2A) is being programmed to a respective target data state (e.g., B or C). Other non-volatile storage elements (e.g., 240, 250 in FIG. 2A) in a program operation reach a target data state (A) before the one non-volatile storage element reaches its target data state (B, C). Further, a set of latches (e.g., set 194, 195 and 196 for storage elements 230, 240 and 250, respectively) for each storage element comprise a number N1 latches (QPW1, QPW2) which each store a bit of data, and a count of program pulses in the slow programming mode zone is determined from the N1 latches. Each set of latches also comprises a number N22 latches (LP, UP) which each store a bit of data, where the target data state of the one non-volatile storage element is determined from the N2 latches.

When programming is not yet completed for the other non-volatile storage elements: the N2 latches comprise one bit combination (e.g., 00 or 01) to identify the target data state (e.g., B or C) of the one non-volatile storage element. The one bit combination (00 or 01) is different than another bit combination (e.g., 10 for the A state) which identifies the target data state of the other non-volatile storage elements in their respective sets of latches (195, 196). When programming is completed for the other (A state) non-volatile storage elements: the N2 latches comprise the another bit combination to identify the target data state of the one non-volatile storage element and to provide, in combination with the N1 latches, an additional value for the count. That is, the 10 combination now identifies the B state, for instance, instead of the A state.

The A state does not need to be identified at this point since programming is completed for the A state. The state machine, for instance, can include logic which cause the update of the latches and now interprets LP/UP=10 in combination with the QPW latch or latches to provide the new count value. The concept can be extended to the use of more than two QPW latches as well.

Note that, for the B state, the count is not based on the N2 latches (LP and UP) when the programming of the other non-volatile storage elements is not yet completed. The N2 latches (LP and UP) only identify the target data state when the programming of the other non-volatile storage elements is not yet completed, and the count is based only on the QPW1 latch.

FIG. 8C depicts a program operation in which verify operations are performed for different target data states as the program operation progresses, and where a bit combination can be re-used according to the programming progress. The horizontal axis depicts program pulse number and the vertical axis depicts control gate or word line voltage. Generally, a program operation can involve applying a pulse train to a selected word line, where the pulse train includes multiple program-verify iterations. The program portion of the program-verify iteration comprises a program pulse, and the verify portion of the program-verify iteration comprises one or more verify pulses.

For each program pulse, a square waveform is depicted, although other shapes are possible such as a multilevel shape or a ramped shape. A pulse train typically includes program pulses which increase stepwise in amplitude in each program-verify iteration using a fixed of varying step size. A new pulse train can be applied in each programming pass of a multi-pass program operation, starting at an initial Vpg level and ending at a final Vpg level which does not exceed a maximum allowed level. The initial Vpg levels can be the same or different in different programming passes. The final Vpg levels can also be the same or different in different programming passes. The step size can be the same or different in the different programming passes. In some cases, a smaller step size is used in a final programming pass to reduce Vth distribution widths.

The pulse train 900 includes a series of program pulses 905, 910, 915, 920, 925, 930, 935, 940, 945, 950, 955, 960, 965, 970 and 975 th at are applied to a word line selected for programming, and an associated set of non-volatile storage elements. One, two or three verify levels are provided after each program pulse as an example, based on the target data states which are being verified. 0 V may be applied to the selected word line between the program and verify pulses. For example, an A-state verify pulse (e.g., waveform 906) may be applied after each of the first, second and third program pulses 905, 910 and 915, respectively. A- and B-state verify pulses (e.g., waveform 921) may be applied after each of the fourth, fifth and sixth program pulses 920, 925 and 930, respectively. A-, B- and C-state verify pulses (e.g., waveform 936) may be applied after each of the seventh and eighth program pulses 935 and 940, respectively. B- and C-state verify pulses (e.g., waveform 946) may be applied after each of the ninth, tenth and eleventh program pulses 945, 950 and 955, respectively. Finally, a C-state verify pulse (e.g., waveform 961) may be applied after each of the twelfth, thirteenth, fourteenth and fifteenth program pulses 960, 965, 970 and 975, respectively.

In this example, the A state storage elements complete programming after the eighth program pulse so that their bit combination can be re-used starting with the ninth program pulse for the B or C state storage elements. In another example, the B state storage elements complete programming after the eleventh program pulse so that their bit combination (along with the A state bit combination) can be re-used starting with the twelfth program pulse for the C state storage elements.

As discussed, program speed differs for different storage elements during a program operation and is difficult to optimize for a set of storage elements. FIG. 9 shows threshold voltage distributions for multiple strings and multiple blocks of an example memory apparatus. As shown, in the areas highlighted by the dashed boxes, some of the data states exhibit over programming. One category of such over programming is known as periodic over programming due to its periodic nature of over programming. FIG. 10 shows a plot of a maximum failure bit count versus a programming voltage (VPGMU). As illustrated, periodicity of the periodic over programming issue is equal to a delta programming voltage DVPGMU (difference between programming voltages of successive program pulses). In general, periodic over programming is an intrinsic programming issue, which gets worse with tightened natural threshold voltage Vth (NVT) distributions and with higher DVPGMU. Since tighter NVT (natural threshold voltage Vth) distributions are desired for high precision programming and higher DVPGMU is one of the main candidates for performance improvement, periodic over programming is expected to become worse for future generations of NAND memory. In recent generations of 3D NAND, periodic over programming (periodic OP) has become more prominent. Periodic over programming could become a major problem causing high read errors on outlier memory apparatuses. Screening these outliers could, for example, result in severe yield loss.

FIG. 11 shows example threshold voltage distributions for multiple loops of a program operation illustrating two broad cases when periodic over programming occurs. The first case, Case-1, is when some abnormal cells are faster than the normal cells (i.e., able to be programmed faster compared to normal cells). In a loop N−1, when the normal cells fail verify, though having higher median threshold voltage Vth, a majority of the distribution of abnormal cells marginally fail verify. So, in loop N, these abnormal cells will be over-programmed. The second case, Case-2, is when some abnormal cells are slower than the normal cells (i.e., not able to programmed as quickly as normal cells). In loop N, when normal cells are fully programmed, distribution of the abnormal cells marginally fail verify and will take an additional loop, resulting in over-programming. Accordingly, any variation in the speed of cells can increase the problem and when occurs, the problem will be worse for cells with tighter natural threshold voltage Vth (NVT) distribution. Such a phenomenon applies for different data states, since periodic over programming can happen for various states independently due to the way individual state verify levels are tuned. Also, since periodic over programming depends on programming speed of cells, cells can be susceptible for periodic over programming with change in cycling conditions and/or change in operating temperatures. Thus, any countermeasure employed must be dynamic to cater for changing over programming situation with cycling and temperature.

Consequently, described herein is a non-volatile memory apparatus (e.g., memory device 190 in FIG. 1). The memory apparatus includes a plurality of non-volatile storage elements (e.g., storage elements 230, 240, 250, 260 and 270 in FIG. 2A) connected to a word line (e.g., WL0-WL63 in FIG. 2A). Each of the plurality of non-volatile storage elements are configured to be programmed to a respective target data state among a plurality of target data states (e.g., "Er", "A", "B", "C", "D", "E", "F" and "G" in FIG. 6D). The apparatus also includes a respective bit line (e.g. BL0 to BL11 of FIG. 2A) associated with each of the plurality of non-volatile storage elements. In addition, the apparatus includes a control circuit (e.g., any one of, or a combination of, control circuitry 110, state machine 112, decoders 114/160, power control module 116, sense blocks 100 (including the processor 192 and managing circuit MC0 in FIG. 3A), read/write circuits 165, and controller 150) configured, in a program operation, to apply one of a plurality of program pulses to the word line, the plurality of program pulses progressively increasing in magnitude in each of a plurality of loops by a program step voltage DVPGMU. The control circuit is also configured, in the program operation, to count an over programming number of the plurality of non-volatile storage elements having a threshold voltage exceeding at least one over programming verify level VOPi, VOP_VLi, VOP_VHi of the respective target data state being less than a default verify level and based on the program step voltage DVPGMU. The control circuit adjusts a voltage of the respective bit line of the plurality of non-volatile storage elements to one or more adjusted levels to modulate a programming speed in response to the over programming number being greater than a predetermined over programming number. The one or more adjusted levels are greater or less than an initial level by a delta bit line voltage ΔVBLC.

According to an aspect, the at least one over programming verify level VOPi of the respective target data state (e.g., state 'i') is the default verify level of the respective target data state minus the program step voltage DVPGMU multiplied by a factor x.

In more detail, in a first countermeasure, Countermeasure-1, the delta bit line voltage ΔVBLC is positive, so the one or more adjusted levels are greater than the initial level (i.e., the voltage of the respective bit line of the plurality of non-volatile storage elements is increased by the delta bit line voltage ΔVBLC). Thus, Countermeasure 1 (without QPW) involves having a verify level for over programming (VOPi) for each data state 'i' (i.e., at least one over programming verify level VOPi of the respective target data state), such that VOPi=Verify level for state 'i'−x*DVPGMU, where the factor x is a positive integer. For the simplest case, x=1 i.e., VOPi=Verify level for state 'i'−DVPGMU (i.e., VOPi is DVPGMU behind the verify level for data state 'i'). Once the distribution for state 'i' crosses the VOPi level, the number of bits going above VOPi are counted. If the value is greater than the pre-calibrated number, which is based on the behavior of normal cells, the bit line voltage is increased by the delta bit line voltage ΔVBLC for the entire 'i' state distribution to slow down the cells for matching normal cells. Then disable VOP verify for state 'i' and continue with normal programming.

In a second countermeasure, Countermeasure-2, the delta bit line voltage ΔVBLC is negative, so the one or more adjusted levels are less than the initial level (i.e., the voltage of the respective bit line of the plurality of non-volatile storage elements is decreased by the delta bit line voltage ΔVBLC). This involves having a verify level for OP (VOPi) for each state such that VOPi=Verify level for state 'i'−x*DVPGMU, where the factor x is a positive integer. For the simplest case, x=1 i.e., VOPi=Verify level for state 'i'−DVPGMU, i.e., VOPi is DVPGMU behind the verify level for state Once the distribution for state 'i' crosses the VOPi level, the number of bits going above VOPi are counted. If the value is greater than the pre-calibrated number, which is based on the behavior of normal cells, the bit line voltage is decreased by ΔVBLC for the entire 'i' state distribution to make the cells faster. Then disable VOP verify for state 'i' and continue with normal programming.

Thus, for the first and second countermeasures, Countermeasure-1 and Countermeasure-2, the control circuit is also configured to determine whether the over programming number of the plurality of non-volatile storage elements having the threshold voltage exceeding the at least one over programming verify level VOPi of the respective target data state is greater than an over programming bit ignore criterion. The control circuit is additionally configured to determine whether the over programming number is greater than the predetermined over programming number in response to the over programming number being greater than the over programming bit ignore criterion. The control circuit then applies a subsequent one of the plurality of program pulses to the word line and counts the over programming number of the plurality of non-volatile storage elements having the threshold voltage exceeding the at least one over programming verify level VOPi of the respective target data state in response to the over programming number not being greater than the over programming bit ignore criterion. The control circuit is configured to disable counting the over programming number of the plurality of non-volatile storage elements having the threshold voltage exceeding the over programming verify level of the respective target data state and continue the program operation in response to the over programming number not being greater than the predetermined over programming number. In addition, the control circuit is configured to disable counting the over programming number of the plurality of non-volatile storage elements having the threshold voltage exceeding the at least one over programming verify level VOPi of the respective target data state and continue the program operation following adjusting the voltage of the respective bit line of the plurality of non-volatile storage elements to the one or more adjusted levels. According to an aspect, the delta bit line voltage $\Delta$VBLC can be varied based on the over programming number of the plurality of non-volatile storage elements having the threshold voltage exceeding the at least one over programming verify level VOPi; however, it should be appreciated that the delta bit line voltage $\Delta$VBLC may instead be a fixed or predetermined value.

FIGS. 12 and 13 show example threshold voltage distributions for multiple loops of a program operation illustrating the two broad cases shown in FIG. 11 when periodic over programming occurs. Specifically, the example threshold voltage distributions for the first case, Case-1, are shown without any countermeasures, with the first countermeasure, Countermeasure-1, with the second countermeasure, Countermeasure-2 in FIG. 12. Similarly, the example threshold voltage distributions for the second case, Case-2, are shown without any countermeasures, with the first countermeasure, Countermeasure-1, with the second countermeasure, Countermeasure-2 in FIG. 13. In each of the example threshold voltage distributions, the at least one over programming verify level VOPi of the respective target data state is shown relative to the default verify level of the respective target data state.

A third countermeasure, Countermeasure-3, is also provided for use with the "quick pass write" (QPW) technique described above. The initial level of the voltage of the respective bit line of the plurality of non-volatile storage elements allows programming of each of the plurality of non-volatile storage elements and is common for each of the plurality of non-volatile storage elements. As discussed above, the program operation includes a slow programming mode in which the threshold voltage of each of the plurality of non-volatile storage elements is compared to a verify low level VL of the respective target data state. In the slow programming mode, the voltage of the respective bit line of each of the plurality of non-volatile storage elements having the threshold voltage greater than the verify low level VL of the respective target data state is adjusted from the initial level to a slow programming level. The program operation includes a fast programming mode in which the threshold voltage of each of the plurality of non-volatile storage elements is compared to a verify high level VH of the respective target data state. In the fast programming mode, the voltage of the respective bit line of each of the plurality of non-volatile storage elements having the threshold voltage greater than the verify high level VH of the respective target data state is adjusted from the verify low level VL to a power supply voltage level inhibiting the plurality of non-volatile storage elements having the threshold voltage greater than the verify high level VH of the respective target data state from further programming during the program operation.

Thus, the at least one over programming verify level VOPi, VOP_VLi, VOP_VHi of the respective target data state includes an over programming low verify level VOP_VLi and an over programming high verify level VOP_VHi. The over programming number includes an over programming low number associated with the over programming low verify level VOP_VLi and an over programming high number associated with the over programming high verify level VOP_VHi. The predetermined over programming number includes a predetermined over programming low number associated with the over programming low verify level VOP_VLi and a predetermined over programming high number associated with the over programming high verify level VOP_VHi. Periodic over programming when QPW is enabled can happen for two reasons: a) Majority cells barely fail verify low VL and in next program pulse, receive full DVPGM and pass verify high VH without undergoing QPW thereby causing over programming or b) majority cells barely fail verify high VH and in next program pulse, receive effectively reduced DVPGM (due to program slow down by QPW bit line voltage VBLC_QPW) and pass verify high VH while undergoing QPW thereby causing over programming.

So, the third countermeasure, Countermeasure 3 (with QPW), involves having two verify levels for OP detection, VOP_VLi & VOP_VHi, for each state 'i' such that VOP VLi=VL for state 'i'-x*DVPGMU and VOP VHi=VH for state 'i'-x*DVPGMU, where x is a positive integer. For the simplest case, x=1 i.e., VOP_VLi=VL for state 'i'-DVPGMU and VOP_VHi=VH for state 'i'-DVPGMU, i.e., VOP_VLi & VOP_VHi are DVPGMU behind the VL & VH levels respectively for state Once the distribution for state 'i' crosses the VOP_VLi and/or VOP_VHi level, the number of bits going above VOP_VLi & VOP_VHi are counted. If the values are greater than the pre-calibrated numbers for either VOP_Li or VOP_Hi, which are based on the behavior of normal cells, the bit line voltage is increased by $\Delta$VBLC for the entire 'i' state distribution to slow down the cells for matching normal cells. When these cells pass VL, they will undergo QPW with BL voltage equivalent to VBLC_QPW+ $\Delta$VBLC.

Accordingly, the control circuit is further configured, in a first algorithm, to determine whether the over programming low number of the plurality of non-volatile storage elements having the threshold voltage exceeding the over programming low verify level VOP_VLi of the respective target data state is greater than an over programming low bit ignore criterion associated with the over programming low verify level VOP_VLi. The control circuit also is configured to determine whether the over programming low number is greater than the predetermined over programming low number in response to the over programming low number being greater than the over programming low bit ignore criterion. The control circuit is configured to apply a subsequent one of the plurality of program pulses to the word line and count the over programming low number of the plurality of non-volatile storage elements having the threshold voltage exceeding the at least one over programming low verify level VOP_VLi of the respective target data state in response to the over programming low number not being greater than the over programming low bit ignore criterion. In addition, the control circuit is configured to disable counting the over programming low number of the plurality of non-volatile storage elements having the threshold voltage exceeding the over programming low verify level VOP_VLi of the respective target data state. The control circuit continues the program operation using the slow programming mode and the fast programming mode in response to the over programming low number not being greater than the predetermined over programming low number. The control circuit is configured to disable counting the over programming low number of the plurality of non-volatile storage elements having the threshold voltage exceeding the over programming low verify level VOP_VLi of the respective target data state. The control circuit continues the program operation using the slow programming mode and the fast programming mode following adjusting the voltage of the respective bit line of the plurality of non-volatile storage elements to the one or more adjusted levels. The voltage of the respective bit line of each of the plurality of non-volatile storage elements having the threshold voltage greater than the verify low level VL of the respective target data state is adjusted from the initial level to an elevated slow programming level.

Simultaneously with the first algorithm, the control circuit is further configured, in a second algorithm, to determine whether the over programming high number of the plurality of non-volatile storage elements having the threshold voltage exceeding the over programming high verify level VOP_VHi of the respective target data state is greater than an over programming high bit ignore criterion associated with the over programming high verify level VOP_VHi. The control circuit is also configured to determine whether the over programming low number is greater than the predetermined over programming high number in response to the over programming high number being greater than the over programming high bit ignore criterion. The control circuit is additionally configured to apply another subsequent one of the plurality of program pulses to the word line and count the over programming high number of the plurality of non-volatile storage elements having the threshold voltage exceeding the at least one over programming high verify level VOP_VHi of the respective target data state in response to the over programming low number not being greater than the over programming high bit ignore criterion. The control circuit disables counting the over programming high number of the plurality of non-volatile storage elements having the threshold voltage exceeding the over programming high verify level VOP_VHi of the respective target data state. The control circuit then continues the program operation using the slow programming mode and the fast programming mode in response to the over programming high number not being greater than the predetermined over programming high number. The control circuit is also configured to disable counting the over programming high number of the plurality of non-volatile storage elements having the threshold voltage exceeding the over programming high verify level VOP_VHi of the respective target data state. The control circuit continues the program operation using the slow programming mode and the fast programming mode following adjusting the voltage of the respective bit line of the plurality of non-volatile storage elements to the one or more adjusted levels. The voltage of the respective bit line of each of the plurality of non-volatile storage elements having the threshold voltage greater than the verify low level VL of the respective target data state is adjusted from the initial level to the elevated slow programming level.

According to an aspect, the elevated slow programming level is the slow programming level plus the delta bit line voltage ΔVBLC. The over programming high verify level VOP_VHi is the default verify level of the respective target data state minus the program step voltage DVPGMU multiplied by a factor x.

According to another aspect, the delta bit line voltage ΔVBLC used to adjust the voltage of the respective bit line of the plurality of non-volatile storage elements is different when counting the over programming number of the plurality of non-volatile storage elements exceeding the over programming low verify level VOP_VLi as compared the delta bit line voltage ΔVBLC used to adjust the voltage of the respective bit line of the plurality of non-volatile storage elements when counting the over programming number of the plurality of non-volatile storage elements exceeding the over programming high verify level VOP_VHi.

FIGS. 14-16 illustrate steps of a method of operating a memory apparatus. As discussed above, the memory apparatus includes a plurality of non-volatile storage elements connected to a word line. Each of the plurality of non-volatile storage elements is configured to be programmed to a respective target data state among a plurality of target data states. The non-volatile memory apparatus includes a respective bit line associated with each of the plurality of non-volatile storage elements. So, referring initially to FIGS. 14 and 15, which respectively show the first and second countermeasures, Countermeasure-1 and Countermeasure-2, the method includes the step of 1000 applying one of a plurality of program pulses to the word line in a program operation, the plurality of program pulses progressively increasing in magnitude in each of a plurality of loops by a program step voltage DVPGMU. The method continues with the step of 1002 counting an over programming number of the plurality of non-volatile storage elements having a threshold voltage exceeding at least one over programming verify level VOPi of the respective target data state being less than a default verify level and based on the program step voltage DVPGMU. The method also includes the step of 1004 adjusting a voltage of the respective bit line of the plurality of non-volatile storage elements to one or more adjusted levels to modulate a programming speed in response to the over programming number being greater than a predetermined over programming number. Specifically, the one or more adjusted levels is greater or less than an initial level by a delta bit line voltage ΔVBLC.

As discussed above, for the first countermeasure, Countermeasure-1, the delta bit line voltage ΔVBLC is positive, so the one or more adjusted levels are greater than the initial level (i.e., the voltage of the respective bit line of the plurality of non-volatile storage elements is increased by the delta bit line voltage ΔVBLC). Thus, as shown in FIG. 14, the step of 1004 adjusting the voltage of the respective bit line of the plurality of non-volatile storage elements to the one or more adjusted levels to modulate the programming speed in response to the over programming number being greater than the predetermined over programming number includes the step of 1006 increasing the voltage of the respective bit line of the plurality of non-volatile storage elements by the delta bit line voltage ΔVBLC in response to the over programming number being greater than the predetermined over programming number. For the second countermeasure, Countermeasure-2, the delta bit line voltage ΔVBLC is negative, so the one or more adjusted levels are less than the initial level (i.e., the voltage of the respective bit line of the plurality of non-volatile storage elements is decreased by the delta bit line voltage ΔVBLC). Therefore, as shown in FIG. 15, the step of 1004 adjusting the voltage of the respective bit line of the plurality of non-volatile storage elements to the one or more adjusted levels to modulate the programming speed in response to the over programming number being greater than the predetermined over programming number includes the step of 1008 decreasing the voltage of the respective bit line of the plurality of non-volatile storage elements by the delta bit line voltage ΔVBLC in response to the over programming number being greater than the predetermined over programming number. According to an aspect, the at least one over programming verify level VOPi of the respective target data state is the default verify level of the respective target data state minus the program step voltage DVPGMU multiplied by a factor x.

Still referring to FIGS. 14 and 15, after the step of 1002 counting the over programming number of the plurality of non-volatile storage elements having the threshold voltage exceeding the at least one over programming verify level VOPi of the respective target data state being less than the default verify level and based on the program step voltage DVPGMU, the method further includes the step of 1010 determining whether the over programming number of the plurality of non-volatile storage elements having the threshold voltage exceeding the at least one over programming verify level VOPi of the respective target data state is greater than an over programming bit ignore criterion. The next step of the method is 1012 determining whether the over programming number is greater than the predetermined over programming number in response to the over programming number being greater than the over programming bit ignore criterion. The method proceeds by 1014 applying a subsequent one of the plurality of program pulses to the word line and counting the over programming number of the plurality of non-volatile storage elements having the threshold voltage exceeding the at least one over programming verify level VOPi of the respective target data state in response to the over programming number not being greater than the over programming bit ignore criterion. The method also includes the steps of 1016 disabling counting the over programming number of the plurality of non-volatile storage elements having the threshold voltage exceeding the over programming verify level of the respective target data state and 1018 continuing the program operation in response to the over programming number not being greater than the predetermined over programming number. The method also includes the step of 1020 disabling counting the over programming number of the plurality of non-volatile storage elements having the threshold voltage exceeding the at least one over programming verify level VOPi of the respective target data state and 1022 continuing the program operation following adjusting the voltage of the respective bit line of the plurality of non-volatile storage elements to the one or more adjusted levels.

As discussed, the initial level of the voltage of the respective bit line of the plurality of non-volatile storage elements allows programming of each of the plurality of non-volatile storage elements and is common for each of the plurality of non-volatile storage elements. The program operation includes a slow programming mode in which the threshold voltage of each of the plurality of non-volatile storage elements is compared to a verify low level VL of the respective target data state and the voltage of the respective bit line of each of the plurality of non-volatile storage elements having the threshold voltage greater than the verify low level VL of the respective target data state is adjusted from the initial level to a slow programming level. The program operation includes a fast programming mode in which the threshold voltage of each of the plurality of non-volatile storage elements is compared to a verify high level VH of the respective target data state and the voltage of the respective bit line of each of the plurality of non-volatile storage elements having the threshold voltage greater than the verify high level VH of the respective target data state is adjusted from the verify low level VL to a power supply voltage level inhibiting the plurality of non-volatile storage elements having the threshold voltage greater than the verify high level VH of the respective target data state from further programming during the program operation.

The at least one over programming verify level VOPi of the respective target data state includes an over programming low verify level VOP_VLi and an over programming high verify level VOP_VHi. The over programming number includes an over programming low number associated with the over programming low verify level VOP_VLi and an over programming high number associated with the over programming high verify level VOP_VHi. The predetermined over programming number includes a predetermined over programming low number associated with the over programming low verify level VOP_VLi and a predetermined over programming high number associated with the over programming high verify level VOP_VHi.

Thus, now referring to FIG. 16, the method, in a first algorithm, after the step of 1002 counting the over programming number of the plurality of non-volatile storage elements having the threshold voltage exceeding the at least one over programming verify level VOPi of the respective target data state being less than the default verify level and based on the program step voltage DVPGMU, further includes the step of 1024 determining whether the over programming low number of the plurality of non-volatile storage elements having the threshold voltage exceeding the over programming low verify level VOP_VLi of the respective target data state is greater than an over programming low bit ignore criterion associated with the over programming low verify level VOP_VLi. The method continues with the step of 1026 determining whether the over programming low number is greater than the predetermined over programming low number in response to the over programming low number being greater than the over programming low bit ignore criterion. The next step of the method is 1028 applying a subsequent one of the plurality of program pulses to the word line and counting the over programming low number of the plurality of non-volatile storage elements having the threshold voltage exceeding the at least one over programming low verify level VOP_VLi of the respective target data state in response to the over programming low number not being greater than the over programming low bit ignore criterion. The method also includes the steps of 1030 disabling counting the over programming low number of the plurality of non-volatile storage elements having the threshold voltage exceeding the over programming low verify level VOP_VLi of the respective target data state and 1032 continuing the program operation using the slow programming mode and the fast programming mode in response to the over programming low number not being greater than the predetermined over programming low number. The method proceeds by 1034 disabling counting the over programming low number of the plurality of non-volatile storage elements having the threshold voltage exceeding the over programming low verify level VOP_VLi of the respective target data state and 1036 continuing the program operation using the slow programming mode and the fast programming mode following adjusting the voltage of the respective bit line of the plurality of non-volatile storage elements to the one or more adjusted levels, the voltage of the respective bit line of each of the plurality of non-volatile storage elements having the threshold voltage greater than the verify low level VL of the respective target data state being adjusted from the initial level to an elevated slow programming level.

Still referring to FIG. 16, simultaneously with the first algorithm, in a second algorithm, after the step of 1002 counting the over programming number of the plurality of non-volatile storage elements having the threshold voltage exceeding the at least one over programming verify level VOPi of the respective target data state being less than the default verify level and based on the program step voltage DVPGMU, the method further includes the step of 1038 determining whether the over programming high number of the plurality of non-volatile storage elements having the threshold voltage exceeding the over programming high verify level VOP_VHi of the respective target data state is greater than an over programming high bit ignore criterion associated with the over programming high verify level VOP_VHi. The method continues with the step of 1040 determining whether the over programming low number is greater than the predetermined over programming high number in response to the over programming high number being greater than the over programming high bit ignore criterion. The method proceeds by 1042 applying another subsequent one of the plurality of program pulses to the word line and counting the over programming high number of the plurality of non-volatile storage elements having the threshold voltage exceeding the at least one over programming high verify level VOP_VHi of the respective target data state in response to the over programming low number not being greater than the over programming high bit ignore criterion. The next step of the method is 1044 disabling counting the over programming high number of the plurality of non-volatile storage elements having the threshold voltage exceeding the over programming high verify level VOP_VHi of the respective target data state and 1046 continuing the program operation using the slow programming mode and the fast programming mode in response to the over programming high number not being greater than the predetermined over programming high number. The method also includes the step of 1048 disabling counting the over programming high number of the plurality of non-volatile storage elements having the threshold voltage exceeding the over programming high verify level VOP_VHi of the respective target data state and 1050 continuing the program operation using the slow programming mode and the fast programming mode following adjusting the voltage of the respective bit line of the plurality of non-volatile storage elements to the one or more adjusted levels, the voltage of the respective bit line of each of the plurality of non-volatile storage elements having the threshold voltage greater than the verify low level VL of the respective target data state being adjusted from the initial level to the elevated slow programming level. According to an aspect, the elevated slow programming level is the slow programming level plus the delta bit line voltage ΔVBLC.

According to another aspect, the over programming high verify level VOP_VHi is the default verify level of the respective target data state minus the program step voltage DVPGMU multiplied by a factor x. In addition, the delta bit line voltage ΔVBLC used to adjust the voltage of the respective bit line of the plurality of non-volatile storage elements is different when counting the over programming number of the plurality of non-volatile storage elements exceeding the over programming low verify level VOP_VLi as compared the delta bit line voltage ΔVBLC used to adjust the voltage of the respective bit line of the plurality of non-volatile storage elements when counting the over programming number of the plurality of non-volatile storage elements exceeding the over programming high verify level VOP_VHi.

So, the memory apparatuses and method steps described herein provide three countermeasures for periodic over programming, all of which solves the issues described above in real time. Thus, the change in susceptibility with any condition such as cycling, temperature etc. are covered. The memory apparatuses and method steps described herein apply even if intrinsic periodic over programming is magnified by several other factors such as memory hole speed difference. Because the at least one over programming verify level VOPi may be unique for each respective target data state, the countermeasures can be applied selectively for more problematic data states In addition, higher DVPGM may be used to improve performance since there is a lower risk of periodic over programming. Consequently, failure rates of memory apparatuses are reduced, increasing yield and reducing error correction code ECC frequency.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A non-volatile memory apparatus, comprising:
a plurality of non-volatile storage elements connected to a word line, each configured to be programmed to a respective target data state among a plurality of target data states;
a respective bit line associated with each of the plurality of non-volatile storage elements; and
a control circuit configured to, in a program operation:
apply one of a plurality of program pulses to the word line, the plurality of program pulses progressively increasing in magnitude in each of a plurality of loops by a program step voltage,
count an over programming number of the plurality of non-volatile storage elements having a threshold voltage exceeding at least one over programming verify level of the respective target data state being less than a default verify level and based on the program step voltage, the at least one over programming verify level of the respective data state being equal to the default verify level of the respective target data state minus the program step voltage multiplied by a factor, and
adjust a voltage of the respective bit line of the plurality of non-volatile storage elements to one or more adjusted levels to modulate a programming speed in response to the over programming number being greater than a predetermined over programming number, the one or more adjusted levels being greater or less than an initial level by a delta bit line voltage.

2. The non-volatile memory apparatus as set forth in claim 1, wherein the control circuit is further configured to:
determine whether the over programming number of the plurality of non-volatile storage elements having the threshold voltage exceeding the at least one over programming verify level of the respective target data state is greater than an over programming bit ignore criterion;
determine whether the over programming number is greater than the predetermined over programming number in response to the over programming number being greater than the over programming bit ignore criterion;
apply a subsequent one of the plurality of program pulses to the word line and count the over programming number of the plurality of non-volatile storage elements having the threshold voltage exceeding the at least one over programming verify level of the respective target data state in response to the over programming number not being greater than the over programming bit ignore criterion;
disable counting the over programming number of the plurality of non-volatile storage elements having the threshold voltage exceeding the over programming verify level of the respective target data state and continue the program operation in response to the over programming number not being greater than the predetermined over programming number; and
disable counting the over programming number of the plurality of non-volatile storage elements having the threshold voltage exceeding the at least one over programming verify level of the respective target data state and continue the program operation following adjusting the voltage of the respective bit line of the plurality of non-volatile storage elements to the one or more adjusted levels.

3. The non-volatile memory apparatus as set forth in claim 1, wherein:
the program operation includes a slow programming mode in which the threshold voltage of each of the plurality of non-volatile storage elements is compared to a verify low level of the respective target data state and the voltage of the respective bit line of each of the plurality of non-volatile storage elements having the threshold voltage greater than the verify low level of the respective target data state is adjusted from the initial level to a slow programming level;
the program operation includes a fast programming mode in which the threshold voltage of each of the plurality of non-volatile storage elements is compared to a verify high level of the respective target data state and the voltage of the respective bit line of each of the plurality of non-volatile storage elements having the threshold voltage greater than the verify high level of the respective target data state is adjusted from the verify low level to a power supply voltage level inhibiting the plurality of non-volatile storage elements having the threshold voltage greater than the verify high level of the respective target data state from further programming during the program operation;
the at least one over programming verify level of the respective target data state includes an over programming low verify level and an over programming high verify level; and
the control circuit is further configured to disable counting the over programming low number of the plurality of non-volatile storage elements having the threshold voltage exceeding the over programming low verify level of the respective target data state and continue the program operation using the slow programming mode and the fast programming mode following adjusting the voltage of the respective bit line of the plurality of non-volatile storage elements to the one or more adjusted levels, the voltage of the respective bit line of each of the plurality of non-volatile storage elements having the threshold voltage greater than the verify low level of the respective target data state being adjusted from the initial level to an elevated slow programming level.

4. The non-volatile memory apparatus as set forth in claim 3, wherein the elevated slow programming level is the slow programming level plus the delta bit line voltage.

5. The non-volatile memory apparatus as set forth in claim 3, wherein the over programming high verify level is the default verify level of the respective target data state minus the program step voltage multiplied by a factor.

6. The non-volatile memory apparatus as set forth in claim 3, wherein the delta bit line voltage used to adjust the voltage of the respective bit line of the plurality of non-volatile storage elements is different when counting the over programming number of the plurality of non-volatile storage elements exceeding the over programming low verify level as compared the delta bit line voltage used to adjust the voltage of the respective bit line of the plurality of non-volatile storage elements when counting the over programming number of the plurality of non-volatile storage elements exceeding the over programming high verify level.

7. The non-volatile memory apparatus as set forth in claim 1, wherein the delta bit line voltage varies based on the over programming number of the plurality of non-volatile storage elements having the threshold voltage exceeding the at least one over programming verify level.

8. A controller in communication with a non-volatile memory apparatus including a plurality of non-volatile storage elements connected to a word line, each configured to be programmed to a respective target data state among a plurality of target data states, the non-volatile memory apparatus includes a respective bit line associated with each of the plurality of non-volatile storage elements, the controller configured to, in a program operation:
instruct the non-volatile memory apparatus to apply one of a plurality of program pulses to the word line, the plurality of program pulses progressively increasing in magnitude in each of a plurality of loops by a program step voltage;
count an over programming number of the plurality of non-volatile storage elements having a threshold voltage exceeding at least one over programming verify level of the respective target data state, the at least one over programming verify level of the respective target data state being equal to the default verify level of the respective target data state minus the program step voltage multiplied by a factor; and
instruct the non-volatile memory apparatus to adjust a voltage of the respective bit line of the plurality of non-volatile storage elements to one or more adjusted levels to modulate a programming speed in response to the over programming number being greater than a predetermined over programming number, the one or more adjusted levels being greater or less than an initial level by a delta bit line voltage.

9. The controller as set forth in claim 8, wherein the controller is further configured to:
determine whether the over programming number of the plurality of non-volatile storage elements having the threshold voltage exceeding the at least one over programming verify level of the respective target data state is greater than an over programming bit ignore criterion;
determine whether the over programming number is greater than the predetermined over programming number in response to the over programming number being greater than the over programming bit ignore criterion;
instruct the non-volatile memory apparatus to apply a subsequent one of the plurality of program pulses to the word line and count the over programming number of the plurality of non-volatile storage elements having the threshold voltage exceeding the at least one over programming verify level of the respective target data state in response to the over programming number not being greater than the over programming bit ignore criterion;
disable counting the over programming number of the plurality of non-volatile storage elements having the threshold voltage exceeding the over programming verify level of the respective target data state and continue the program operation in response to the over programming number not being greater than the predetermined over programming number; and
disable counting the over programming number of the plurality of non-volatile storage elements having the threshold voltage exceeding the at least one over programming verify level of the respective target data state and continue the program operation following adjusting the voltage of the respective bit line of the plurality of non-volatile storage elements to the one or more adjusted levels.

10. The controller as set forth in claim 8, wherein:
the program operation includes a slow programming mode in which the threshold voltage of each of the plurality of non-volatile storage elements is compared to a verify low level of the respective target data state and the voltage of the respective bit line of each of the plurality of non-volatile storage elements having the threshold voltage greater than the verify low level of the respective target data state is adjusted from the initial level to a slow programming level;
the program operation includes a fast programming mode in which the threshold voltage of each of the plurality of non-volatile storage elements is compared to a verify high level of the respective target data state and the voltage of the respective bit line of each of the plurality of non-volatile storage elements having the threshold voltage greater than the verify high level of the respective target data state is adjusted from the verify low level to a power supply voltage level inhibiting the plurality of non-volatile storage elements having the threshold voltage greater than the verify high level of the respective target data state from further programming during the program operation;
the at least one over programming verify level of the respective target data state includes an over programming low verify level and an over programming high verify level; and
the controller is further configured to disable counting the over programming low number of the plurality of non-volatile storage elements having the threshold voltage exceeding the over programming low verify level of the respective target data state and instruct the non-volatile memory apparatus to continue the program operation using the slow programming mode and the fast programming mode following adjusting the voltage of the respective bit line of the plurality of non-volatile storage elements to the one or more adjusted levels, the voltage of the respective bit line of each of the plurality of non-volatile storage elements having the threshold voltage greater than the verify low level of the respective target data state being adjusted from the initial level to an elevated slow programming level.

11. The controller as set forth in claim 10, wherein the over programming high verify level is the default verify level of the respective target data state minus the program step voltage multiplied by a factor.

12. A method of operating a non-volatile memory apparatus including a plurality of non-volatile storage elements connected to a word line, each configured to be programmed to a respective target data state among a plurality of target data states, the non-volatile memory apparatus including a respective bit line associated with each of the plurality of non-volatile storage elements, the method, in a program operation, comprising the steps of:

applying one of a plurality of program pulses to the word line, the plurality of program pulses progressively increasing in magnitude in each of a plurality of loops by a program step voltage;

counting an over programming number of the plurality of non-volatile storage elements having a threshold voltage exceeding at least one over programming verify level of the respective target data state being equal to a default verify level minus the program step voltage multiplied by a factor; and adjusting a voltage of the respective bit line of the plurality of non-volatile storage elements to one or more adjusted levels to modulate a programming speed in response to the over programming number being greater than a predetermined over programming number, the one or more adjusted levels being greater or less than an initial level by a delta bit line voltage.

13. The non-volatile memory apparatus as set forth in claim 12, wherein method further includes the steps of:

determining whether the over programming number of the plurality of non-volatile storage elements having the threshold voltage exceeding the at least one over programming verify level of the respective target data state is greater than an over programming bit ignore criterion;

determining whether the over programming number is greater than the predetermined over programming number in response to the over programming number being greater than the over programming bit ignore criterion;

applying a subsequent one of the plurality of program pulses to the word line and count the over programming number of the plurality of non-volatile storage elements having the threshold voltage exceeding the at least one over programming verify level of the respective target data state in response to the over programming number not being greater than the over programming bit ignore criterion;

disabling counting the over programming number of the plurality of non-volatile storage elements having the threshold voltage exceeding the over programming verify level of the respective target data state and continuing the program operation in response to the over programming number not being greater than the predetermined over programming number; and disabling counting the over programming number of the plurality of non-volatile storage elements having the threshold voltage exceeding the at least one over programming verify level of the respective target data state and continuing the program operation following adjusting the voltage of the respective bit line of the plurality of non-volatile storage elements to the one or more adjusted levels.

14. The method as set forth in claim 12, wherein:

the program operation includes a slow programming mode in which the threshold voltage of each of the plurality of non-volatile storage elements is compared to a verify low level of the respective target data state and the voltage of the respective bit line of each of the plurality of non-volatile storage elements having the threshold voltage greater than the verify low level of the respective target data state is adjusted from the initial level to a slow programming level;

the program operation includes a fast programming mode in which the threshold voltage of each of the plurality of non-volatile storage elements is compared to a verify high level of the respective target data state and the voltage of the respective bit line of each of the plurality of non-volatile storage elements having the threshold voltage greater than the verify high level of the respective target data state is adjusted from the verify low level to a power supply voltage level inhibiting the plurality of non-volatile storage elements having the threshold voltage greater than the verify high level of the respective target data state from further programming during the program operation;

the at least one over programming verify level of the respective target data state includes an over programming low verify level and an over programming high verify level;

the over programming number includes an over programming low number associated with the over programming low verify level and an over programming high number associated with the over programming high verify level;

the predetermined over programming number includes a predetermined over programming low number associated with the over programming low verify level and a predetermined over programming high number associated with the over programming high verify level; and the method further includes the step of disabling counting the over programming low number of the plurality of non-volatile storage elements having the threshold voltage exceeding the over programming low verify level of the respective target data state and continuing the program operation using the slow programming mode and the fast programming mode following adjusting the voltage of the respective bit line of the plurality of non-volatile storage elements to the one or more adjusted levels, the voltage of the respective bit line of each of the plurality of non-volatile storage elements having the threshold voltage greater than the verify low level of the respective target data state being adjusted from the initial level to an elevated slow programming level.

15. The method as set forth in claim 14, wherein the elevated slow programming level is the slow programming level plus the delta bit line voltage.

16. The method as set forth in claim 14, wherein the over programming high verify level is the default verify level of the respective target data state minus the program step voltage multiplied by a factor.

17. The method as set forth in claim 14, wherein the delta bit line voltage used to adjust the voltage of the respective bit line of the plurality of non-volatile storage elements is different when counting the over programming number of the plurality of non-volatile storage elements exceeding the over programming low verify level as compared the delta bit line voltage used to adjust the voltage of the respective bit line of the plurality of non-volatile storage elements when counting the over programming number of the plurality of non-volatile storage elements exceeding the over programming high verify level.

* * * * *